(12) United States Patent
Yamanishi

(10) Patent No.: US 6,307,730 B1
(45) Date of Patent: Oct. 23, 2001

(54) CAPACITOR FORMED BY LOWER ELECTRODE HAVING INNER AND OUTER UNEVEN SURFACES

(75) Inventor: Nobuyuki Yamanishi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/487,990

(22) Filed: Jan. 20, 2000

(30) Foreign Application Priority Data

Jan. 21, 1999 (JP) .................................... 11-012736

(51) Int. Cl.[7] .................................... H01G 4/005
(52) U.S. Cl. .................. 361/303; 361/305; 257/308; 257/310
(58) Field of Search ............... 361/303, 304, 361/305, 306.1, 313, 321.5; 257/303, 306, 308–310; 438/253, 255

(56) References Cited

U.S. PATENT DOCUMENTS 5,874,335  2/1999  Jenq et al. ..................... 438/255
5,963,804 * 10/1999 Figura et al. ..................... 438/255

FOREIGN PATENT DOCUMENTS

| 2 334 621 A | 8/1999 | (GB) . |
| 4-312971 | 11/1992 | (JP) . |
| 10-158840 | 6/1998 | (JP) . |
| 11-150249 | 6/1999 | (JP) . |
| 11-214646 | 8/1999 | (JP) . |
| 11-289062 | 10/1999 | (JP) . |
| 2000-82746 | 3/2000 | (JP) . |

* cited by examiner

Primary Examiner—Anthony Dinkins
(74) Attorney, Agent, or Firm—McGinn & Gibb, PLLC

(57) ABSTRACT

A capacitor is constructed by a cylindrical lower capacitor electrode layer having uneven inner and outer surfaces, a capacitor insulating layer formed on the cylindrical lower capacitor electrode layer, and an upper capacitor electrode layer formed on the capacitor insulating layer.

5 Claims, 28 Drawing Sheets

CAPACITOR FORMED BY LOWER ELECTRODE HAVING INNER AND OUTER UNEVEN SURFACES

BACKGROUND OF THE INVENTION

1. Field of the Invention

The present invention relates to a capacitor used in a dynamic random access memory (DRAM) device and a method for manufacturing such a capacitor.

2. Description of the Related Art

Generally, a typical memory cell of a DRAM device is formed by one switching metal oxide semiconductor (MOS) transistor and one capacitor for storing information. Also, this capacitor is a so-called stacked capacitor including a lower capacitor electrode, an upper capacitor electrode and a capacitor insulating layer therebetween.

A prior art stacked capacitor is constructed by a cylindrical lower capacitor electrode layer so as to enhance the capacity of the stacked capacitor. Also, in order to reduce the electric resistance to enhance the operation speed, the lower capacitor electrode layer is made of metal or metal compound such as tungsten (W) or titanium nitride (TiN). This structure is called a metal insulator metal (MIM) structure. This prior art stacked capacitor will be explained later in detail.

In the above-described prior art stacked capacitor, however, since the surfaces of the cylindrical capacitor electrode layer are flat, it is difficult to increase the capacity as a result of the ongoing trend of miniaturization.

SUMMARY OF THE INVENTION

It is an object of the present invention to provide a stacked capacitor capable of increasing the capacity.

Another object is to provide a method for manufacturing such a stacked capacitor.

According to the present invention, a stacked capacitor is constructed by a cylindrical lower capacitor electrode layer having uneven inner and outer surfaces, a capacitor insulating layer formed on the cylindrical lower capacitor electrode layer, and an upper capacitor electrode layer formed on the capacitor insulating layer.

The uneven inner and outer surfaces of the cylindrical lower capacitor electrode layer can be obtained by transferring hemi-spherical grained (HSG) polycrystalline silicon.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, prior art methods for manufacturing a stacked capacitor will be explained with reference to FIGS. 1A through 1K and FIGS. 2A through 2D.

FIGS. 1A through 1K are cross-sectional views for explaining a firt prior art method for manufacturing a stacked capacitor which is in this case cylindrical. Note that a lower portion is omitted from FIGS. 1F through 1K.

Figure 1A:
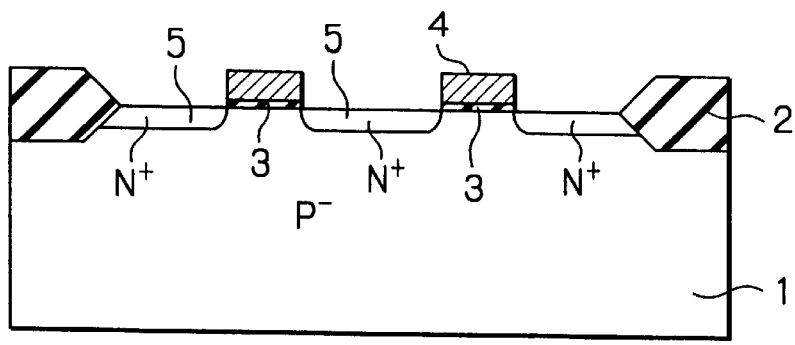
FIGS. 1A through 1K are cross-sectional views for explaining a first prior art method for manufacturing a stacked capacitor.

First, referring to FIG. 1A, a P-type monocrystalline silicon substrate 1 is thermally oxidized by a local oxidation of silicon (LOCOS) process to grow a field silicon oxide layer 2 thereon. Then, a silicon oxide layer (not shown) and a photoresist pattern (not shown) thereon are formed, and $N^+$-type impurity diffusion regions (source and drain regions) 5 are formed within the silicon substrate 1 by implanting $N^+$-type impurities such as arsenic using the photoresist pattern as a mask. Then, the photoresist pattern and the silicon oxide layer (not shown) are removed. Also, a gate silicon oxide layer 3 is formed by thermally oxidizing the silicon substrate 1. Then, a policide layer is deposited by a chemical vapor deposition (CVD) process and si patterned by a photolithography and etching process to form a gate electrode 4. Then, an exposed portion of the gate silicon oxide layer 3 is removed by a dry etching process.

Figure 1B:
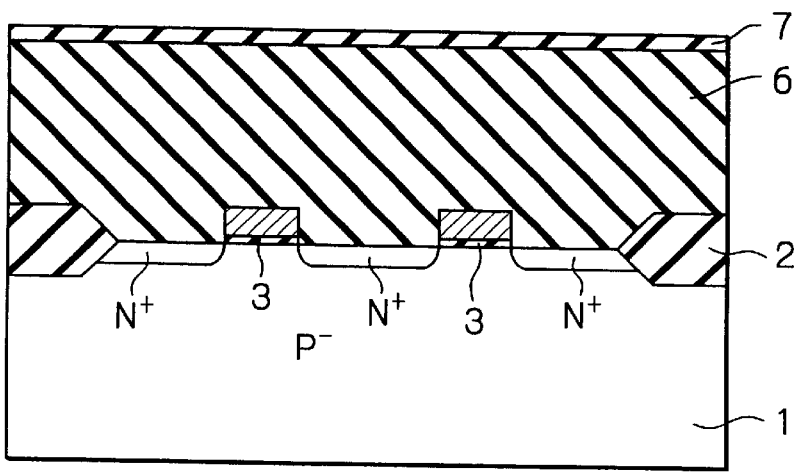

Next, referring to FIG. 1B, a boro-phospho-silicate glass (BPSG) layer 6 and a silicon oxide layer 7 are sequentially deposited by a CVD process on the entire surface.

Figure 1C:
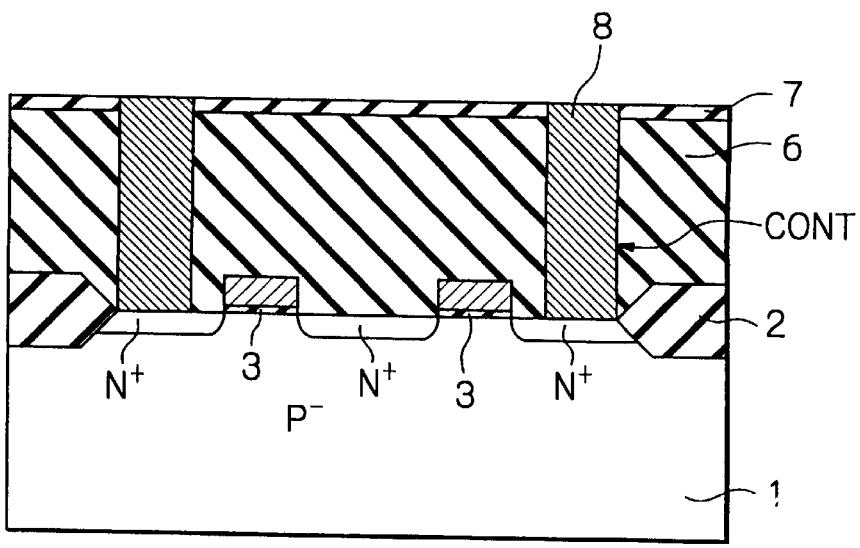

Next, referring to FIG. 1C, a contact hole CONT is perforated in the silicon oxide layer 7 and the BPSG layer 6 by a photolithography and etching process. Then, an about 10 nm thick titanium nitride (TiN) layer (not shown) is deposited by an ion reactive sputtering process on the entire surface, and a tungsten (W) layer (not shown) is deposited on the TiN layer. The W layer and the TiN layer are etched back to bury a contact plug 8 in the contact hole CONT. Note that the TiN layer has good contact characteristics between the silicon substrate 1 and the W layer.

Figure 1D:
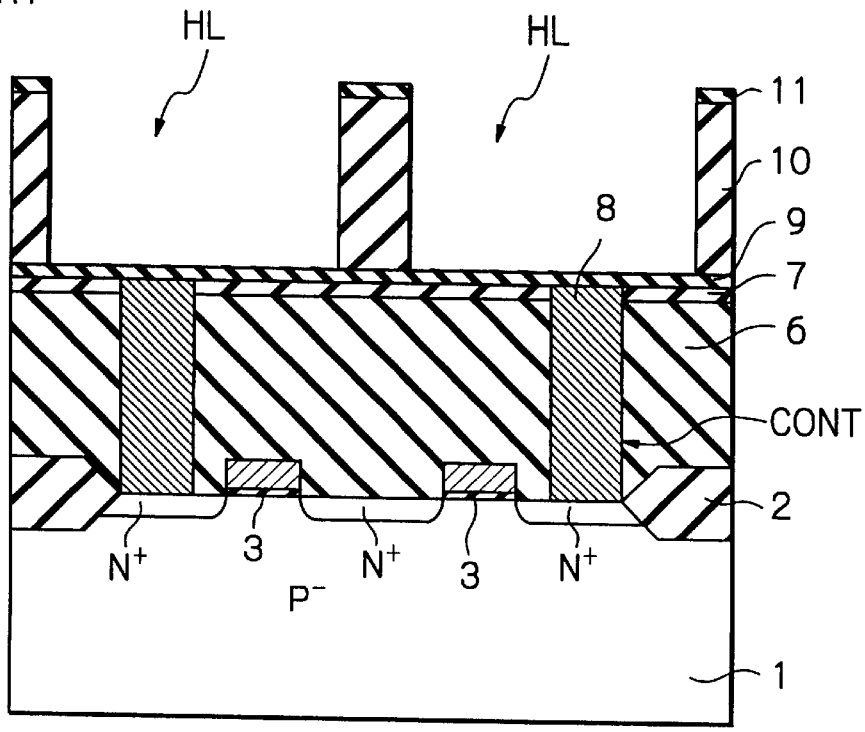

Next, referring to FIG. 1D, an about 30 nm thick silicon nitride layer 9, an about 400 nm thick BPSG layer 10 and an about 50 nm thick silicon oxide layer 11 are sequentially deposited by a CVD process on the entire surface. Note that the silicon nitride layer 9, the BPSG layer 10 and the silicon oxide layer 11 serve as a spacer. Then, the silicon oxide layer 11 and the BPSG layer 10 are patterned by a photolithography and etching process using the silicon nitride layer 9 as an etching stopper, thus creating a lower electrode hole HL.

Figure 1E:
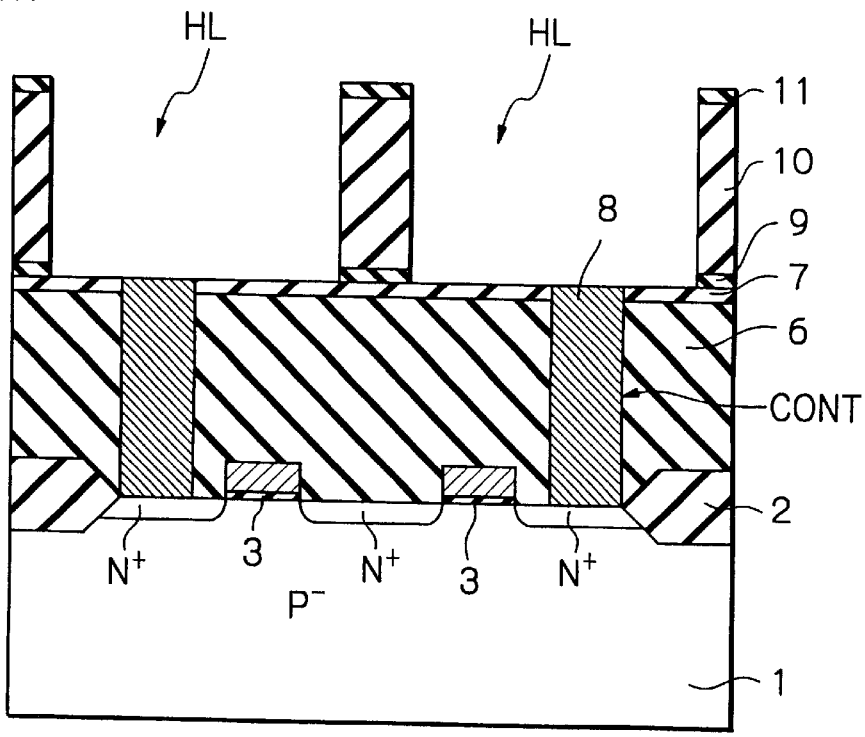

Next, referring to FIG. 1E, an exposed portion of the silicon nitride layer 9 is removed.

Figure 1F:
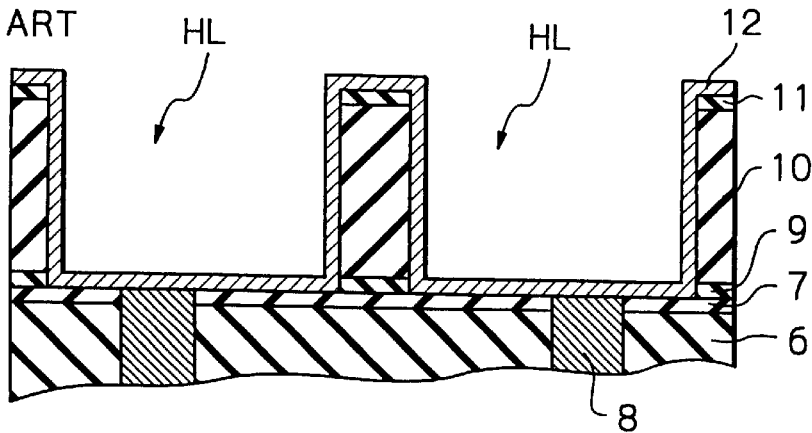

Next, referring to FIG. 1F, an about 50 nm thick W layer 12 is deposited by a CVD process on the entire surface.

Figure 1G:
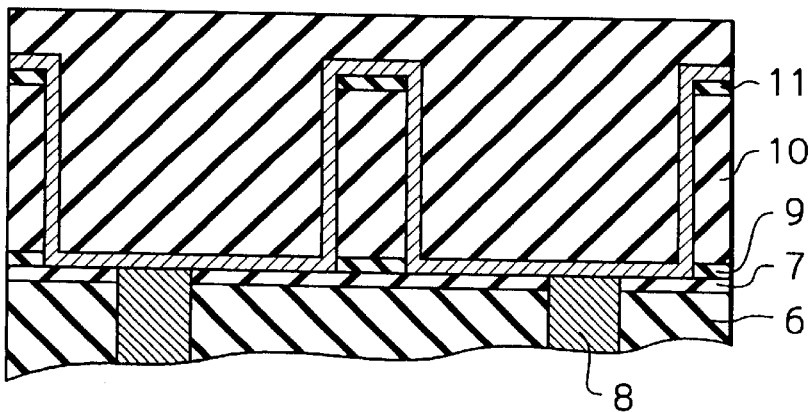

Next, referring to FIG. 1G, a spin-on-glass (SOG) layer 13 made of silica glass is coated and is calcined to protect the bottom of the lower electrode hole HL.

Figure 1H:
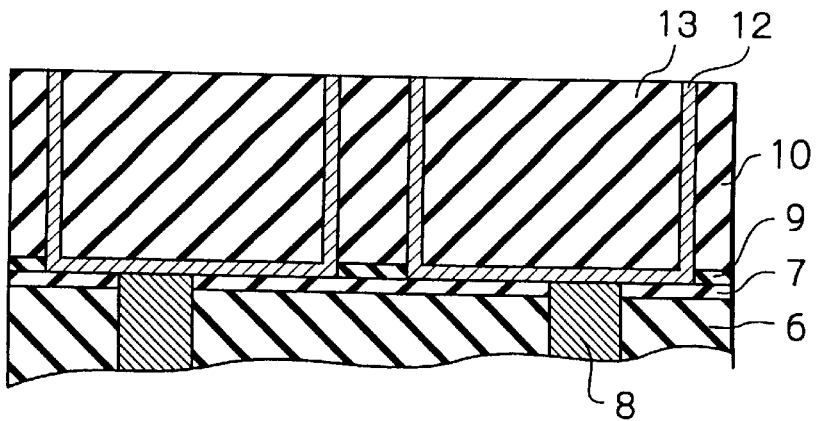

Next, referring to FIG. 1H, the SOG layer 13, the W layer 12 and the silicon oxide layer 11 are polished by a chemical mechanical polishing (CMP) process.

Figure 1I:
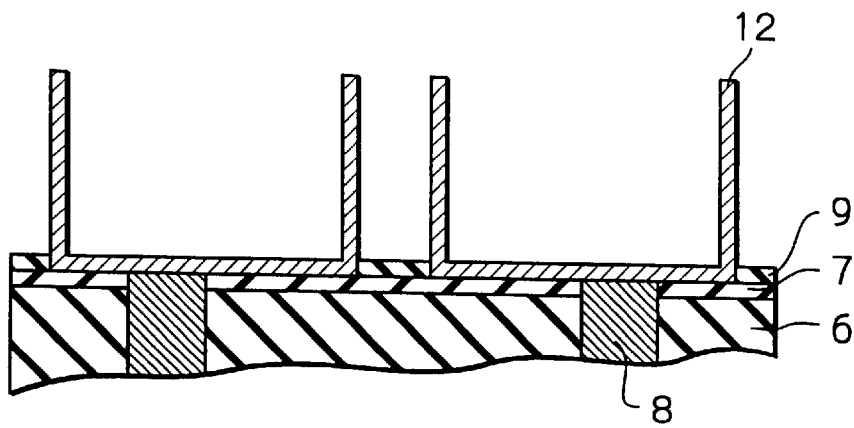

Next, referring to FIG. 1I, the SOG layer 13 and the BPSG layer 10 are removed by a wet etching process using the silicon nitride layer 9 as an etching stopper.

Figure 1J:
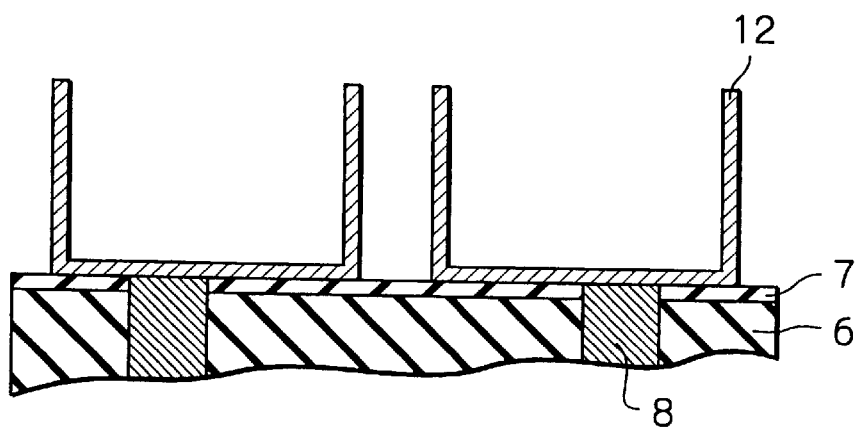

Next, referring to FIG. 1J, the silicon nitride layer 9 is removed. Thus, a cylindrical lower capacitor electrode is constructed by the W layer 12.

Figure 1K:
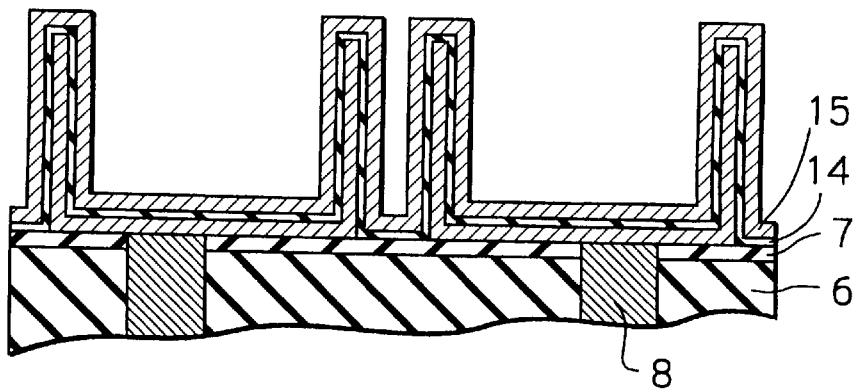

Finally, referring to FIG. 1K, a capacitor insulating layer 14 and an upper capacitor electrode 15 are formed on the cylindrical lower capacitor electrode, thus completing a cylindrical stacked capacitor. Note that the capacitor insulating layer 14 is constructed by a single layer or a multiple layer made of silicon oxide, silicon nitride, $Ta_2O_5$, $Ba_{0.7}Sr_{0.3}TiO_3$ or PZT. Particularly, the capacitor insulating layer 14 is made of a single layer made of $Ta_2O_5$ or a multiple layer made of $Ta_2O_5/SiO_2$. Also, the upper capacitor electrode 15 is made of metal such as W, metal compound such as titanium nitride or doped polycrystalline silicon.

In the prior art method as illustrated in FIGS. 1A through 1K, however, since the inner and outer surfaces of the cylindrical lower capacitor electrode are flat, it is difficult to increase the capacity of the stacked capacitor.

FIGS. 2A through 2D are cross-sectional views for explaining a second prior art method for manufacturing a stacked capacitor which is in this case non-cylindrical (see: JP-A-10-158840).

Figure 2A:
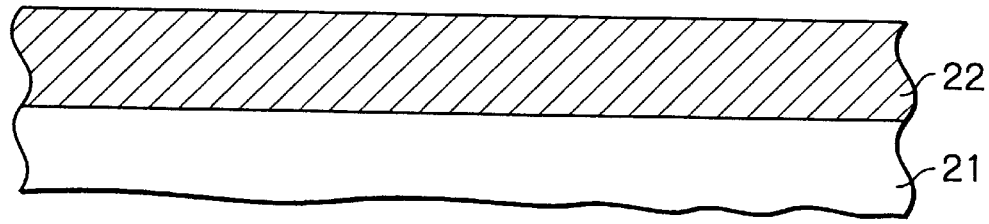
FIGS. 2A through 2D are cross-sectional views for explaining a second prior art method for manufacturing a stacked capacitor.

First, referring to FIG. 2A, a metal layer 22 is deposited on a substrate 21.

Figure 2B:
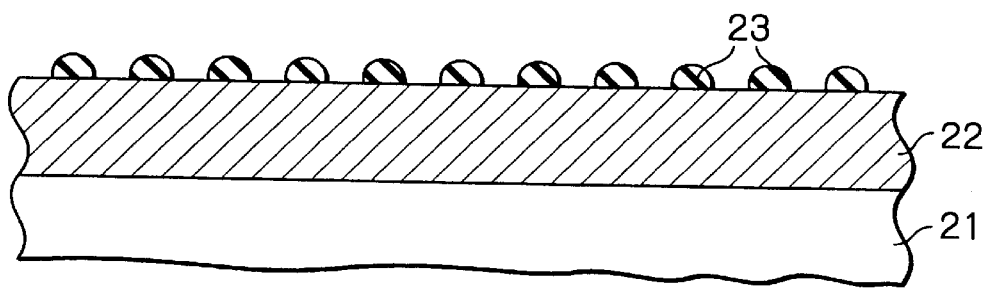

Next, referring to FIG. 2B, silicon oxide ($SiO_2$) particles 23 are grown by a CVD process using a mixture of $SiH_4$ gas and $H_2O_2$ gas.

Figure 2C:
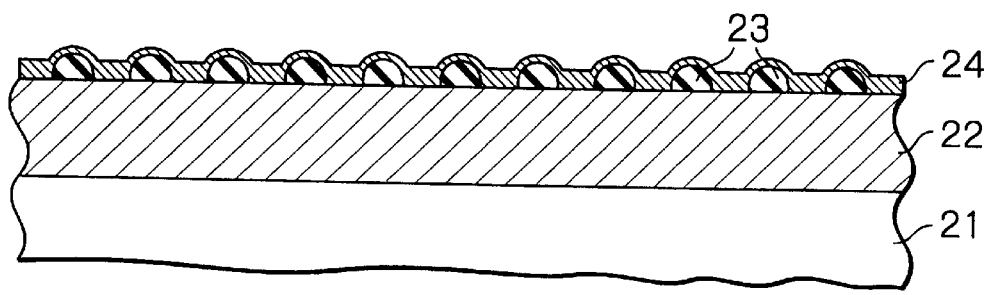

Next, referring to FIG. 2C, a metal layer 24 made of the same material as the metal layer 21 is deposited on the entire surface.

Figure 2D:
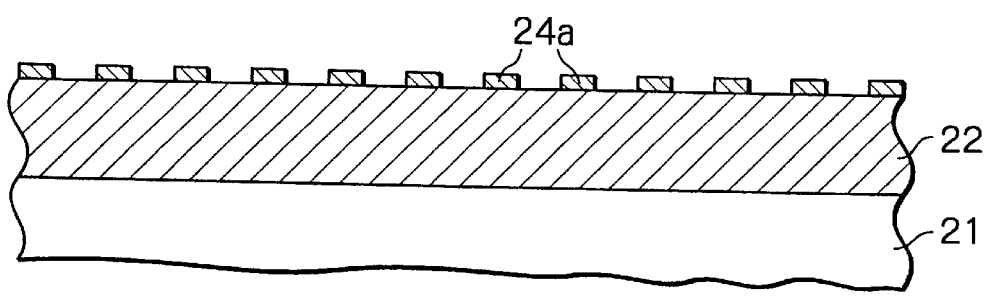

Finally, referring to FIG. 2D, a part of the metal layer 24 on the silicon oxide particles 23 is etched, and then, the silicon oxide particles 23 are removed by a wet etching process using dilute fluoric acid. Thus, residual metal layers 24a are integrated with the metal layer 22 to substantially make the surface of the metal layer 22 uneven, which would increase the capacity of the stacked capacitor.

Even if the uneven surface of the metal layer 22 of the second prior art method as illustrated in FIGS. 2A through 2D is applied to the cylindrical stacked capacitor of the first prior art method as illustrated in FIGS. 1A through 1K, it is difficult to increase the capacity of the cylindrical stacked capacitor due to the following reasons. First, the silicon oxide particles 23 tend to become large and also, the silicon oxide particles 23 vary in size, so that it is difficult to form uniformly sized silicon oxide particles. Particularly, since severe conditions are imposed when forming silicon oxide particles on a vertical plane, silicon oxide particles are not adapted causing a cylindrical lower capacitor electrode having a large height to be uneven. Secondly, since silicon oxide particles are formed on only one side of the electrode, it is difficult to cause both the inner and outer surfaces of the cylindrical lower capacitor electrode to be uneven.

FIGS. 3A through 3J are cross-sectional views for explaining a first embodiment of the method for manufacturing a stacked capacitor according to the present invention. Note that the manufacturing steps as illustrated in FIGS. 1A through 1E are applied to the first embodiment.

Figure 3A:
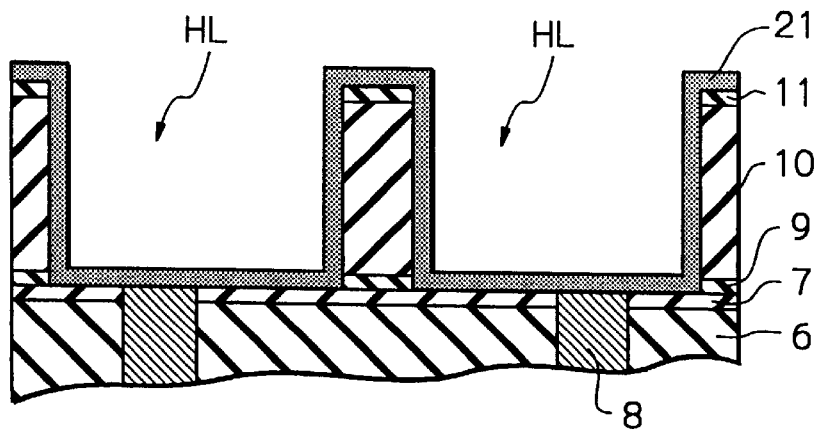
FIGS. 3A through 3J are cross-sectional views for explaining a first embodiment of the method for manufacturing a stacked capacitor according to the present invention.

First, referring to FIG. 3A, after the manufacturing step as illustrated in FIG. 1E is carried out, an about 50 nm thick phosphorus-doped amorphous silicon layer 21 is deposited by a CVD process on the entire surface, including sidewalls of the silicon oxide layer 11, the BPSG layer 10 and the silicon nitride layer 9 within the lower electrode hole HL. In this case, the concentration of phosphorus in the amorphous silicon layer 21 is about $1.0 \times 10^{20}/cm^3$. Note that a non-doped amorphous silicon layer can be used instead of the doped amorphous silicon layer 21.

Figure 3B:
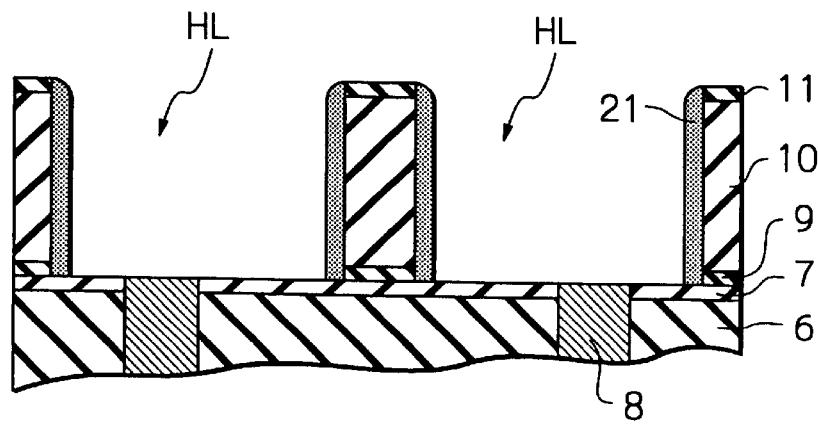

Next, referring to FIG. 3B, the amorphous silicon layer 21 is etched back by a dry etching process to allow the amorphous silicon layer 21 to remain only on the sidewalls of the silicon oxide layer 11, the BPSG layer 10 and the silicon nitride layer 9.

Figure 3C:
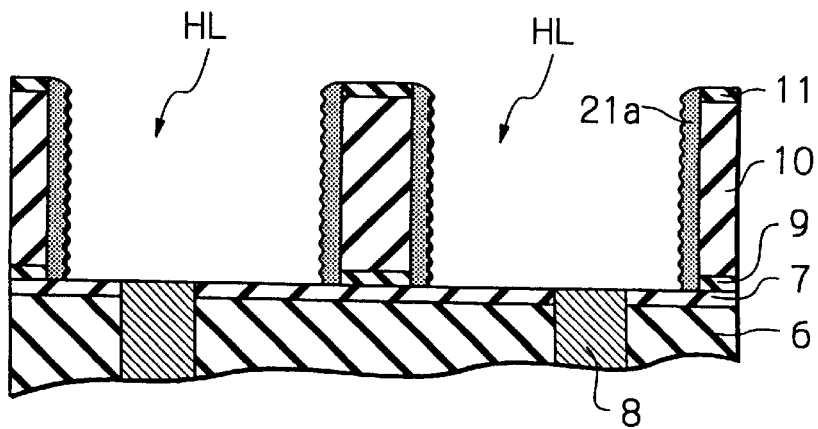

Next, referring to FIG. 3C, the amorphous silicon layer 21 is converted into an HSG polycrystalline silicon layer 21a having an uneven surface. For example, the device is put into a reaction furnace and is stabilized in high vacuum at a temperature of about 550 to 570° C. Then, silane ($SiH_4$) gas is introduced into the reaction furnace at a flow rate of about 50 to 100 sccm for about 15 to 30 minutes while maintaining the above-mentioned temperature. Then, the device is annealed in high vacuum for about 15 to 60 minutes in the same reaction furnace.

Figure 3D:
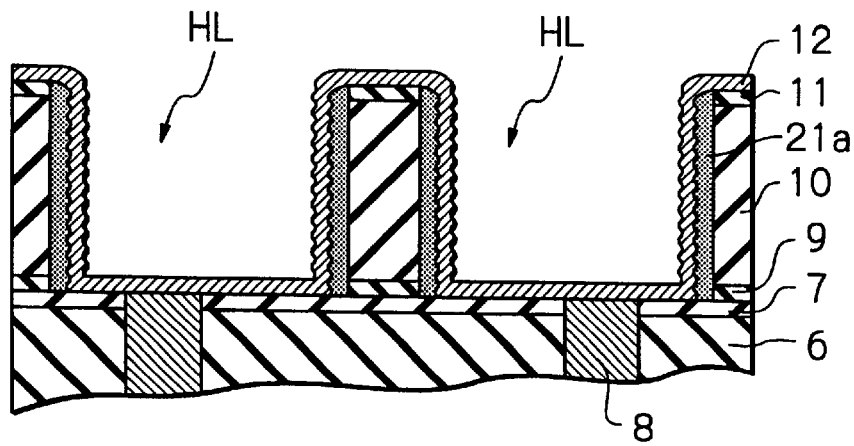

Next, referring to FIG. 3D, in the same way as in FIG. 1F, an about 50 nm thick W layer 12 is deposited by a CVD process on the entire surface.

Figure 3E:
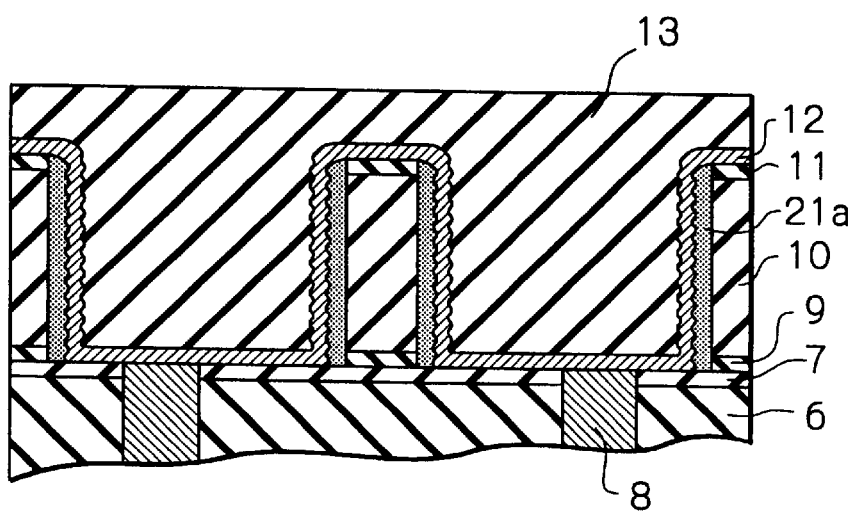

Next, referring to FIG. 3E, in the same way as in FIG. 1G, an SOG layer 13 made of silica glass is coated and is calcined to protect the bottom of the lower electrode hole HL.

Figure 3F:
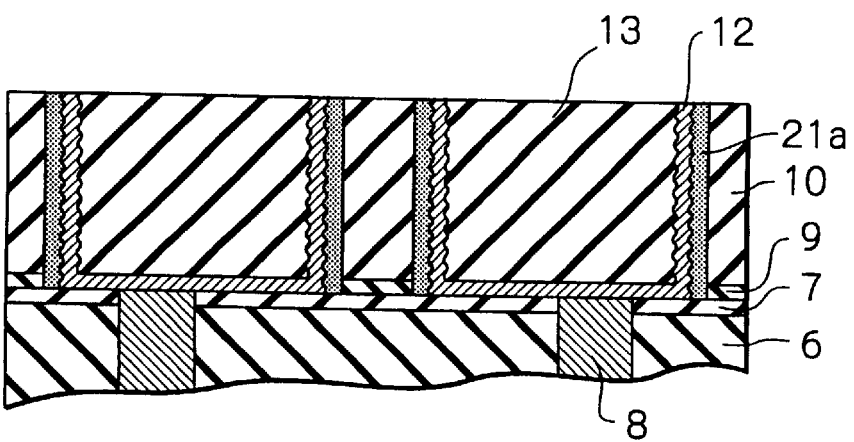

Next, referring to FIG. 3F, in the same way as in FIG. 1H, the SOG layer 13, the W layer 12 and the silicon oxide layer 11 are polished by a CMP process.

Figure 3G:
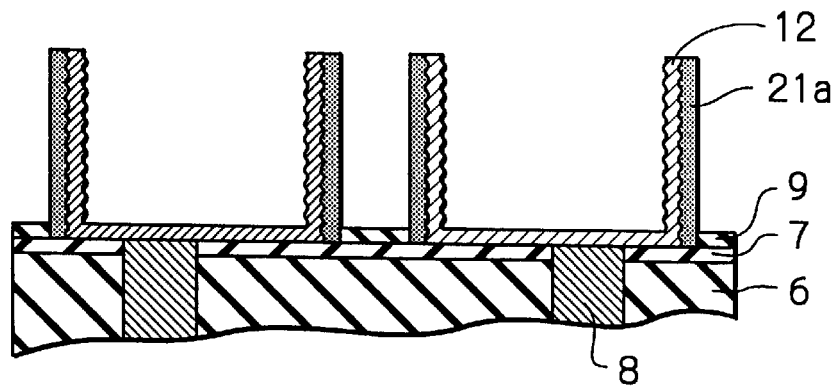

Next, referring to FIG. 3G, in the same way as in FIG. 1I, the SOG layer 13 and the BPSG layer 10 are removed by a wet etching process using the silicon nitride layer 9 as an etching stopper.

Figure 3H:
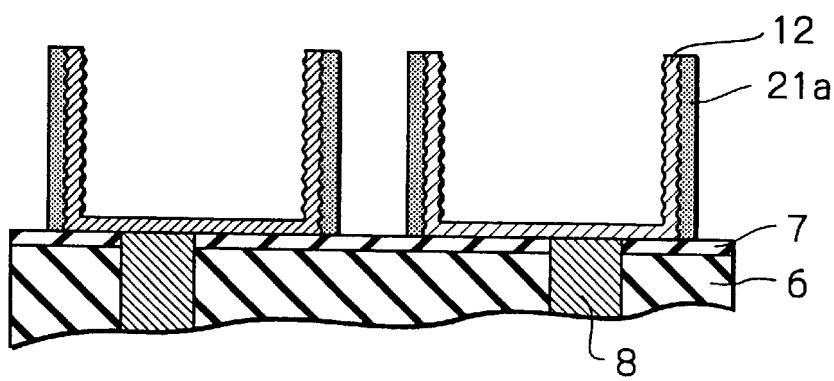

Next, referring to FIG. 3H, in the same way as in FIG. 1J, the silicon nitride layer 9 is removed.

Figure 3I:
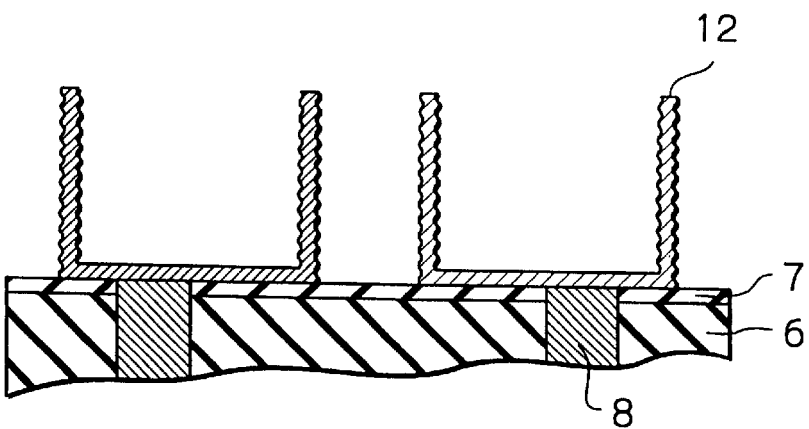

Next, referring to FIG. 3I, the HSG polycrystalline silicon layer 21a is removed by a wet etching process using a chemical solution with contents of $HF:HNO_3:H_2O=1$ to 5%:30 to 60%:30 to 60% to show an etching selectivity relative to the HSG polycrystalline silicon layer 21a and the W layer 12. Thus, a cylindrical lower capacitor electrode is constructed by the W layer 12.

Figure 3J:
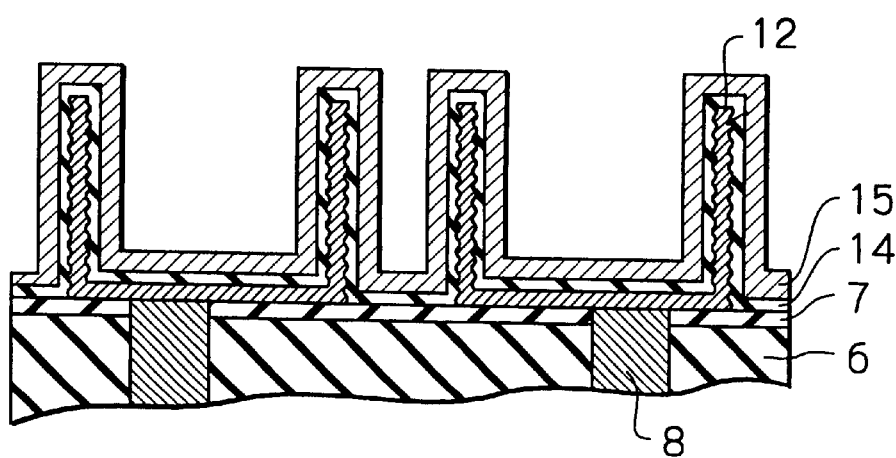

Finally, referring to FIG. 3J, in the same way as in FIG. 1K, a capacitor insulating layer 14 and an upper capacitor electrode 15 are formed on the cylindrical lower capacitor electrode, thus completing a cylindrical stacked capacitor. Note that the capacitor insulating layer 14 is constructed by a single layer or a multiple layer made of silicon oxide, silicon nitride, $Ta_2O_5$, $Ba_{0.7}Sr_{0.3}TiO_3$ or PZT. Particularly, the capacitor insulating layer 14 is made of a single layer made of $Ta_2O_5$ or a multiple layer made of $Ta_2O_5/SiO_2$. Also, the upper capacitor electrode 15 is made of metal such as W, metal compound such as titanium nitride or doped polycrystalline silicon.

In the method as illustrated in FIGS. 3A through 3J, since the inner and outer surfaces of the cylindrical lower capacitor electrode are uneven, it is possible to remarkably increase the capacity of the stacked capacitor.

FIGS. 4A through 4J are cross-sectional views for explaining a second embodiment of the method for manufacturing a stacked capacitor according to the present invention. Note that the manufacturing steps as illustrated in FIGS. 1A through 1E are applied to the second embodiment.

Figure 4A:
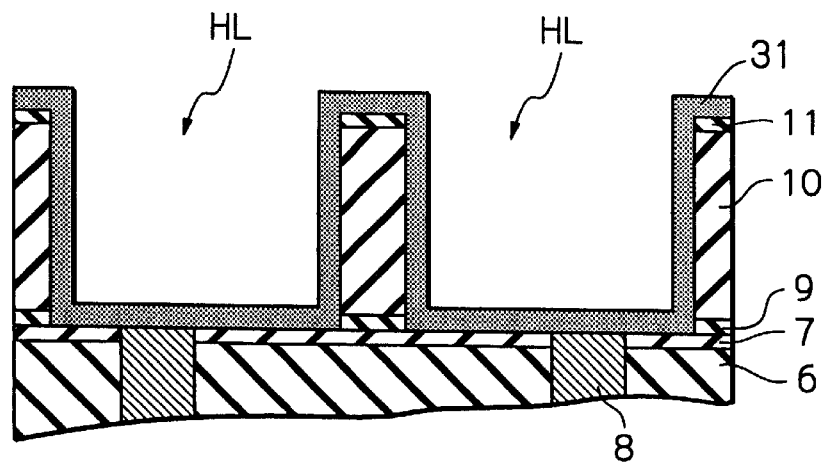
FIGS. 4A through 4K are cross-sectional views for explaining a second embodiment of the method for manufacturing a stacked capacitor according to the present invention.

First, referring to FIG. 4A, in a similar way to those of FIG. 3A, after the manufacturing step as illustrated in FIG. 1E is carried out, an about 50 nm thick amorphous silicon layer 31 is deposited by a CVD process on the entire surface, including sidewalls of the silicon oxide layer 11, the BPSG layer 10 and the silicon nitride layer 9 within the lower electrode hole HL. Note that the amorphous silicon layer 31 can be doped or non-doped.

Figure 4B:
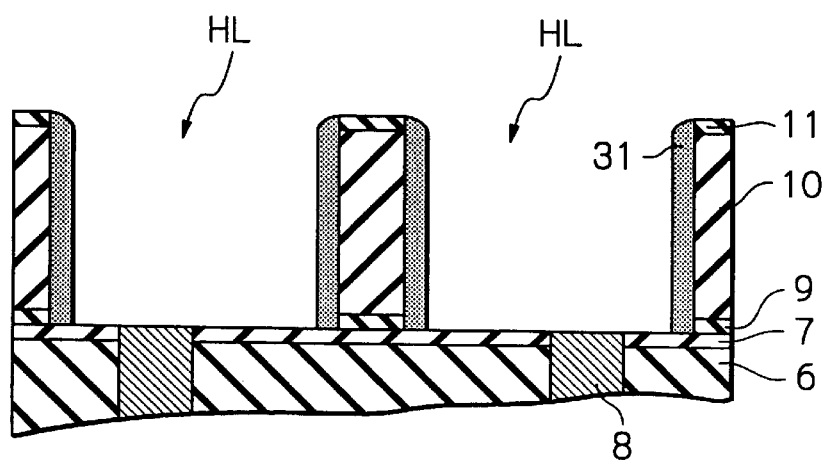

Next, referring to FIG. 4B, in the same way as in FIG. 3B, the amorphous silicon layer 31 is etched back by a dry etching process to allow the amorphous silicon layer 31 to remain only on the sidewalls of the silicon oxide layer 11, the BPSG layer 10 and the silicon nitride layer 9.

Figure 4C:
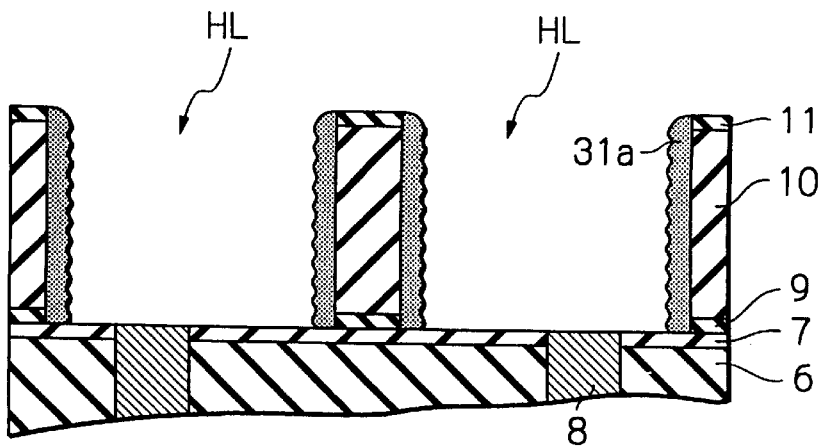

Next, referring to FIG. 4C, in the same way as in FIG. 3C, the amorphous silicon layer 31 is converted into an HSG polycrystalline silicon layer 31a having an uneven surface. For example, the device is put into a reaction furnace and is stabilized in high vacuum at a temperature of about 550 to 570° C. Then, silane (SiH$_4$) gas is introduced into the reaction furnace at a flow rate of about 50 to 100 sccm for about 15 to 30 minutes while maintaining the above-mentioned temperature. Then, the device is annealed in high vacuum for about 15 to 60 minutes in the same reaction furnace.

Figure 4D:
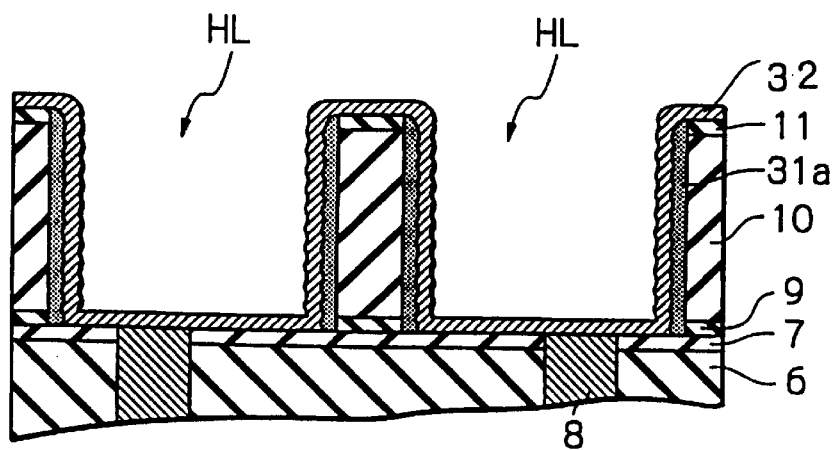

Next, referring to FIG. 4D, an about 50 nm thick titanium nitride (TiN) layer 32 is deposited by a CVD process on the entire surface.

Figure 4E:
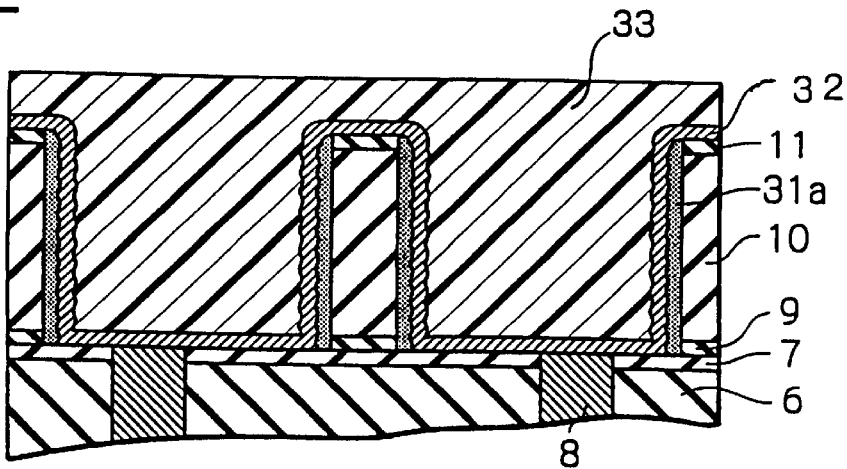

Next, referring to FIG. 4E, a photoresist layer 33 is coated and is cured to protect the bottom of the lower electrode hole HL.

Figure 4F:
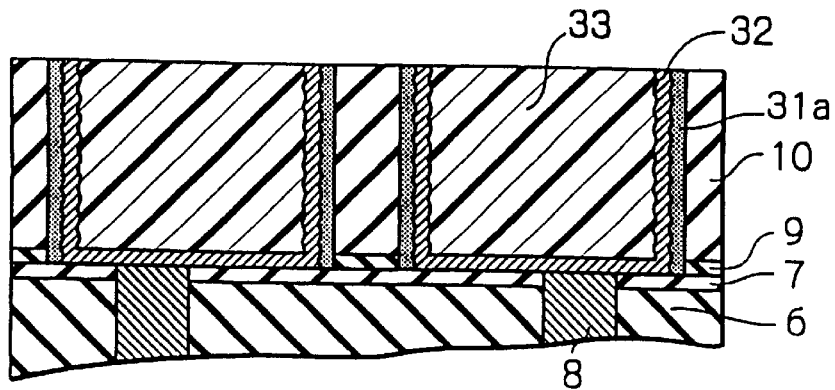

Next, referring to FIG. 4F, the photoresist layer 33, the TiN layer 32 and the silicon oxide layer 11 are etched back by a dry etching process.

Figure 4G:
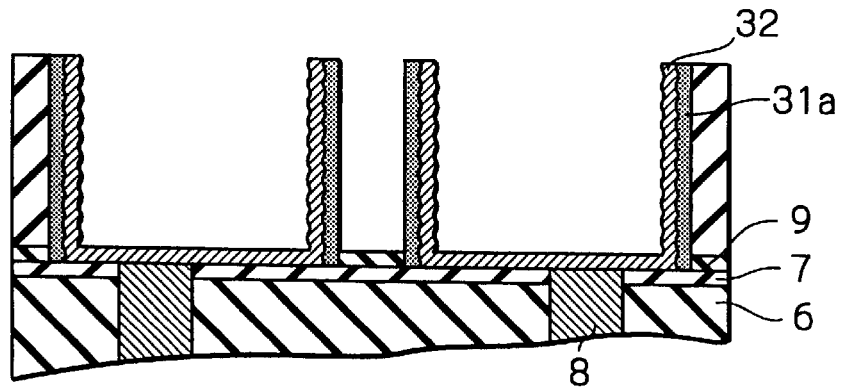

Next, referring to FIG. 4G, the photoresist layer 33 is removed by an ashing process.

Figure 4H:
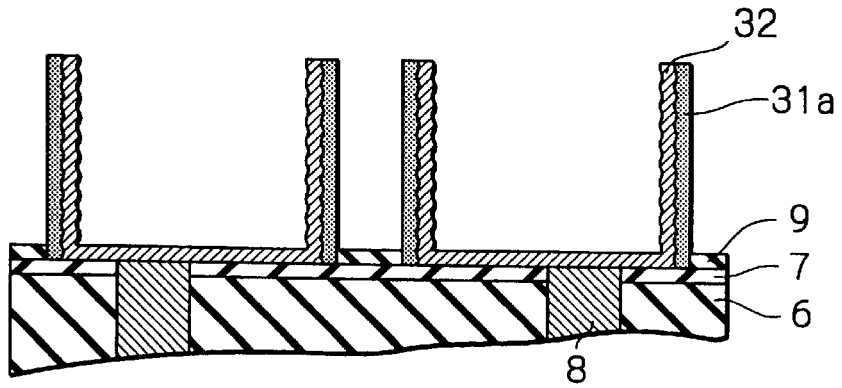

Next, referring to FIG. 4H; in the same way as in FIG. 3G, the BPSG layer 10 is removed by a wet etching process using the silicon nitride layer 9 as an etching stopper.

Figure 4I:
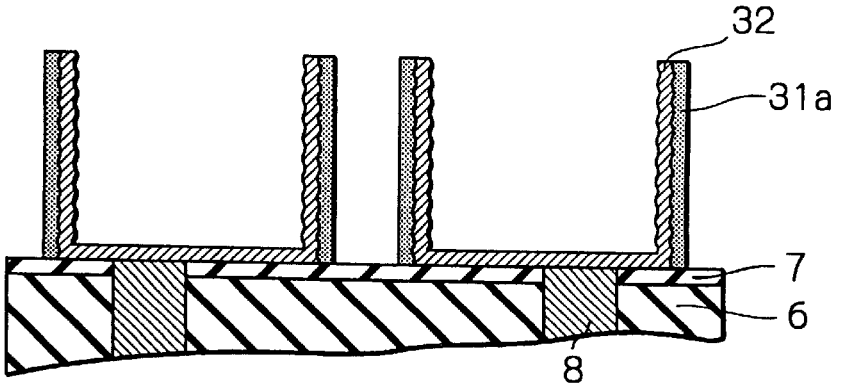

Next, referring to FIG. 4I, in the same way as in FIG. 3H, the silicon nitride layer 9 is removed.

Figure 4J:
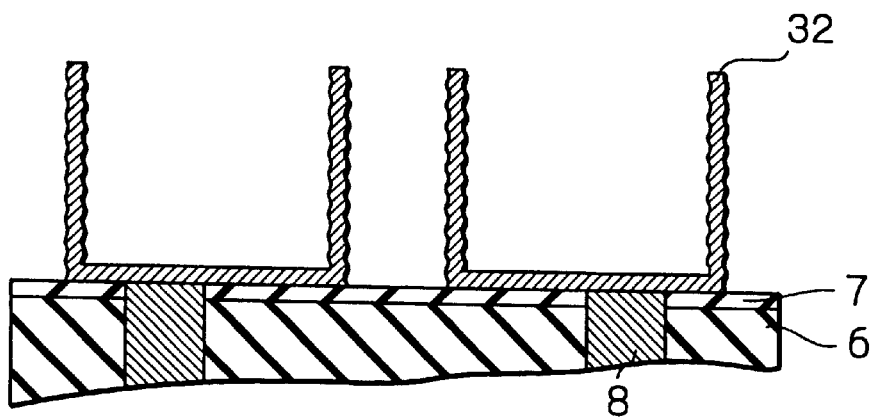

Next, referring to FIG. 4J, in the same way as in FIG. 3I, the HSG polycrystalline silicon layer 31a is removed by a wet etching process using a chemical solution with contents of HF:HNO$_3$:H$_2$O=1 to 5%:30 to 60%:30 to 60% to show an etching selectivity relative to the HSG polycrystalline silicon layer 31a and the TiN layer 32. Thus, a cylindrical lower capacitor electrode is constructed by the TiN layer 32.

Figure 4K:
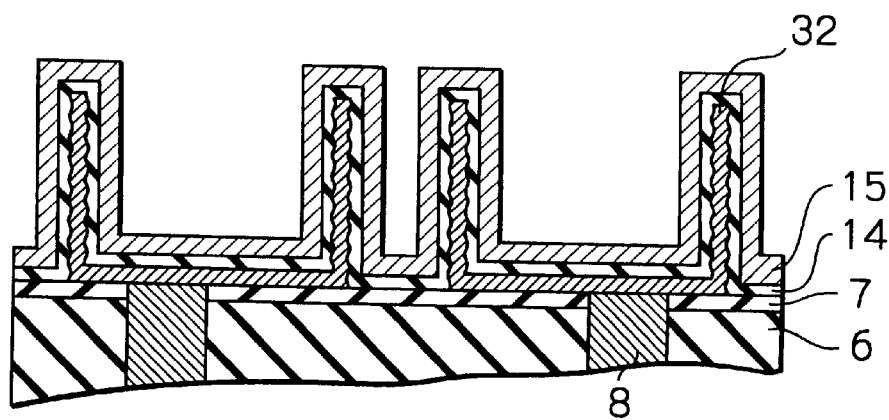

Finally, referring to FIG. 4K, in the same way as in FIG. 3J, a capacitor insulating layer 14 and an upper capacitor electrode 15 are formed on the cylindrical lower capacitor electrode, thus completing a cylindrical stacked capacitor.

Even in the method as illustrated in FIGS. 4A through 4K, since the inner and outer surfaces of the cylindrical lower capacitor electrode is uneven, it is possible to remarkably increase the capacity of the stacked capacitor.

FIGS. 5A through 5G are cross-sectional views for explaining a third embodiment of the method for manufacturing a stacked capacitor according to the present invention. Note that the manufacturing steps as illustrated in FIGS. 1A through 1C are applied to the third embodiment.

Figure 5A:
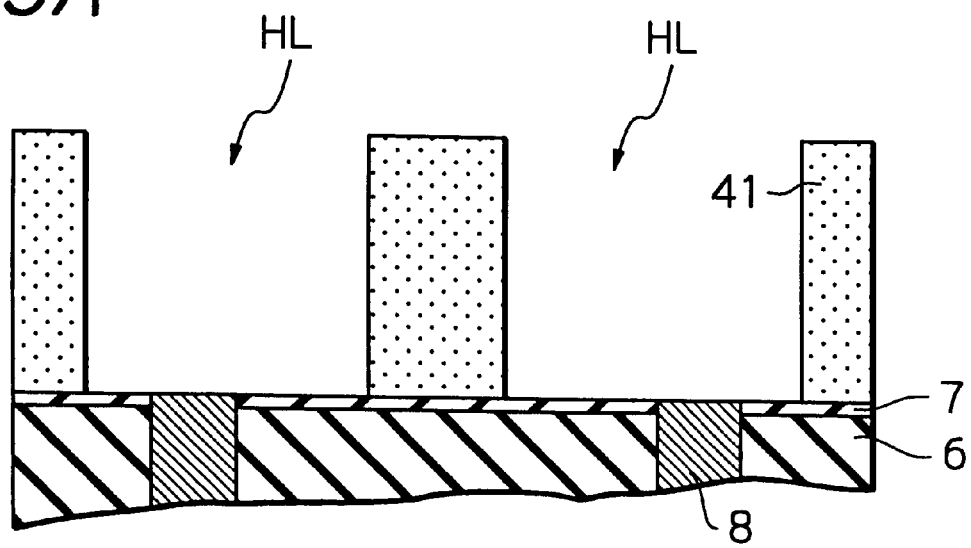
FIGS. 5A through 5G are cross-sectional views for explaining a third embodiment of the method for manufacturing a stacked capacitor according to the present invention.

First, referring to FIG. 5A, after the manufacturing step as illustrated in FIG. 1C is carried out, a phosphorus-doped amorphous silicon layer 41 is deposited by a CVD process on the entire surface. In this case, the concentration of phosphorus in the amorphous silicon layer 41 is about $1.0 \times 10^{20}/\text{cm}^3$. Note that a non-doped amorphous silicon layer can be used instead of the doped amorphous silicon layer 41. Then, the amorphous silicon layer 41 is patterned by a photolithography and etching process to create a lower electrode hole HL.

Figure 5B:
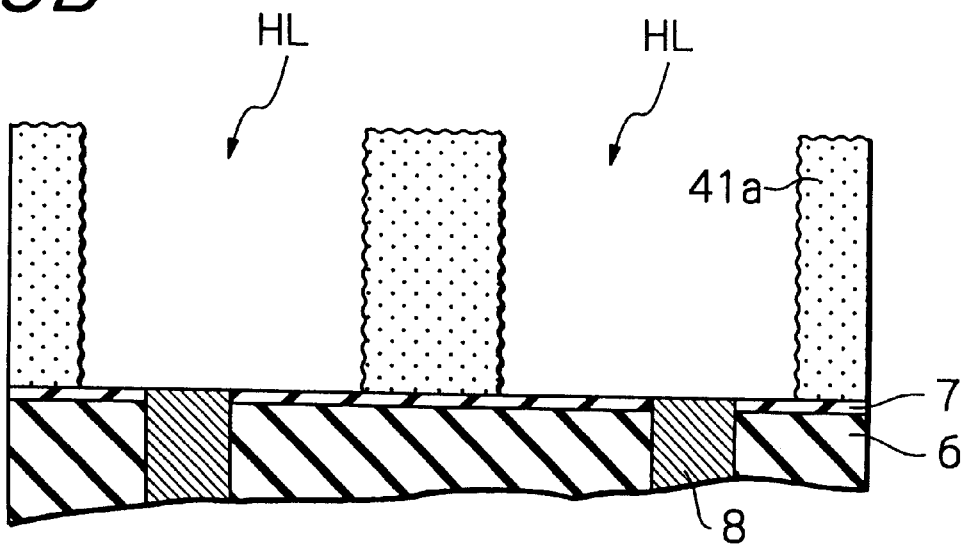

Next, referring to FIG. 5B, in the same way as in FIG. 3C, the amorphous silicon layer 41 is converted into an HSG polycrystalline silicon layer 41a having an uneven surface. For example, the device is put into a reaction furnace and is stabilized in high vacuum at a temperature of about 550 to 570° C. Then, silane (SiH$_4$) gas is introduced into the reaction furnace at a flow rate of about 50 to 100 sccm for about 15 to 30 minutes while maintaining the above-mentioned temperature. Then, the device is annealed in high vacuum for about 15 to 60 minutes in the same reaction furnace.

Figure 5C:
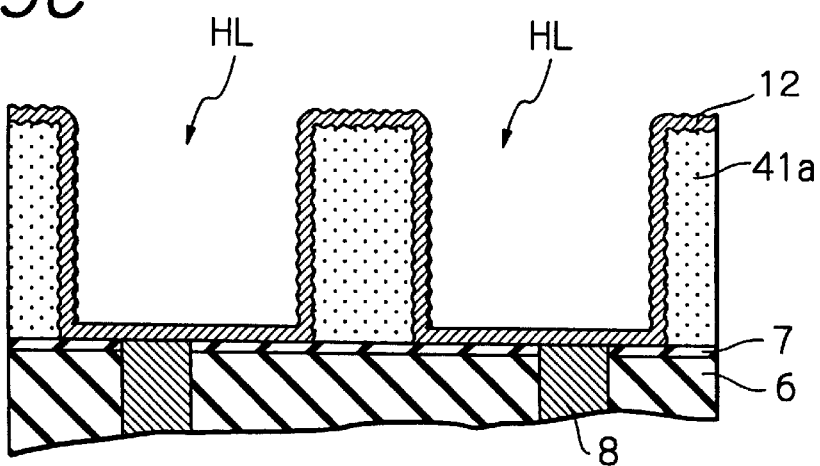

Next, referring to FIG. 5C, in the same way as in FIG. 3D, an about 50 nm thick W layer 12 is deposited by a CVD process on the entire surface.

Figure 5D:
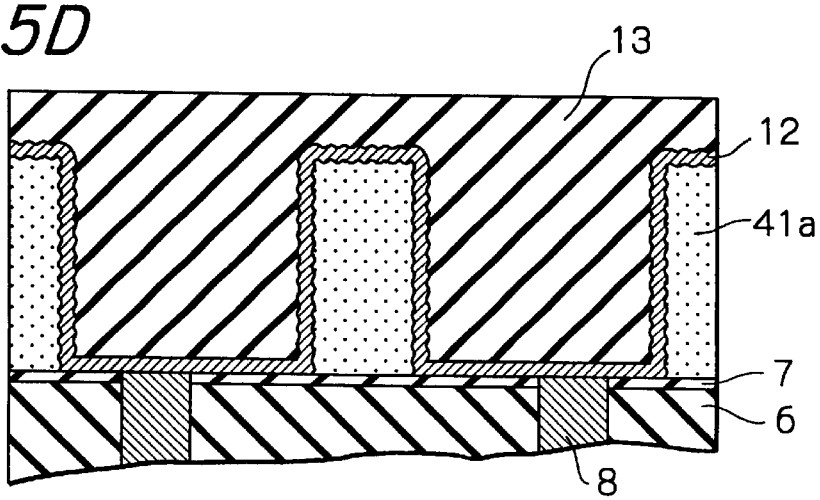

Next, referring to FIG. 5D, in the same way as in FIG. 3E, an SOG layer 13 made of silica glass is coated and is calcined to protect the bottom of the lower electrode hole HL.

Figure 5E:
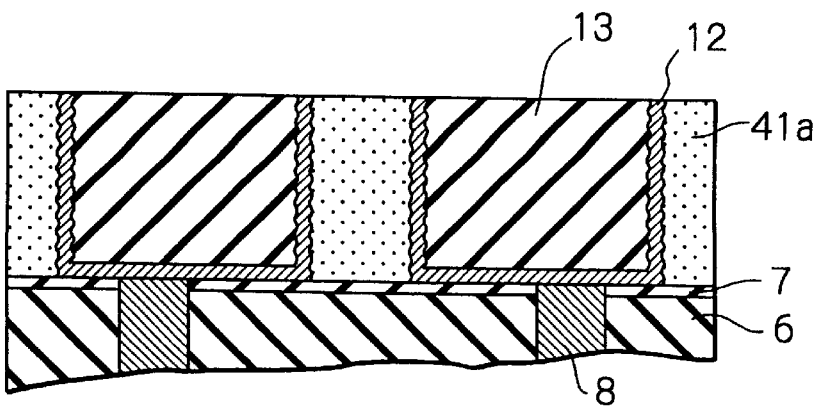

Next, referring to FIG. 5E, the SOG layer 13, the W layer 12 and the HSG polycrystalline silicon layer 41a are etched back by a dry etching process.

Figure 5F:
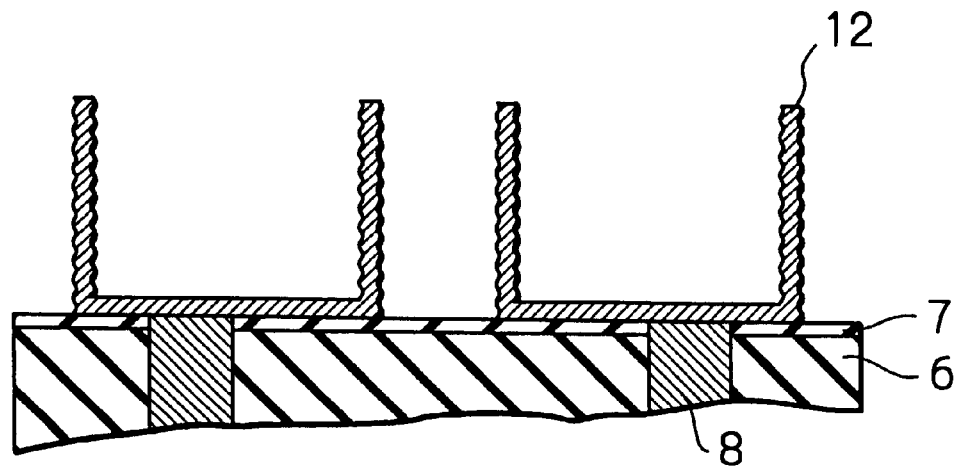

Next, referring to FIG. 5F, the SOG layer 13 is removed by a wet etching process. Then, the HSG polycrystalline silicon layer 41a is removed by a wet etching process using a chemical solution with contents of HF:HNO$_3$:H$_2$O=1 to 5%:30 to 60%:30 to 60% to show an etching selectivity relative to the HSG polycrystalline silicon layer 21a and the W layer 12. Thus, a cylindrical lower capacitor electrode is constructed by the W layer 12.

Figure 5G:
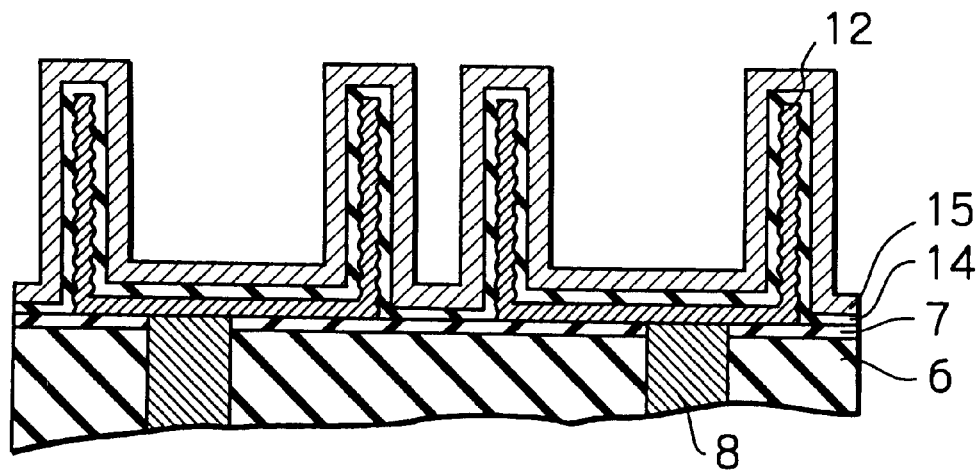

Finally, referring to FIG. 5G, in the same way as in FIG. 3J, a capacitor insulating layer 14 and an upper capacitor electrode 15 are formed on the cylindrical lower capacitor electrode, thus completing a cylindrical stacked capacitor.

Even with the method as illustrated in FIGS. 5A through 5G, since the inner and outer surfaces of the cylindrical lower capacitor electrode are uneven, it is possible to remarkably increase the capacity of the stacked capacitor.

FIGS. 6A through 6K are cross-sectional views for explaining a fourth embodiment of the method for manufacturing a stacked capacitor according to the present invention. Note that the manufacturing steps as illustrated in FIGS. 1A through 1E and FIGS. 3A through 3F are applied to the fourth embodiment.

Figure 6A:
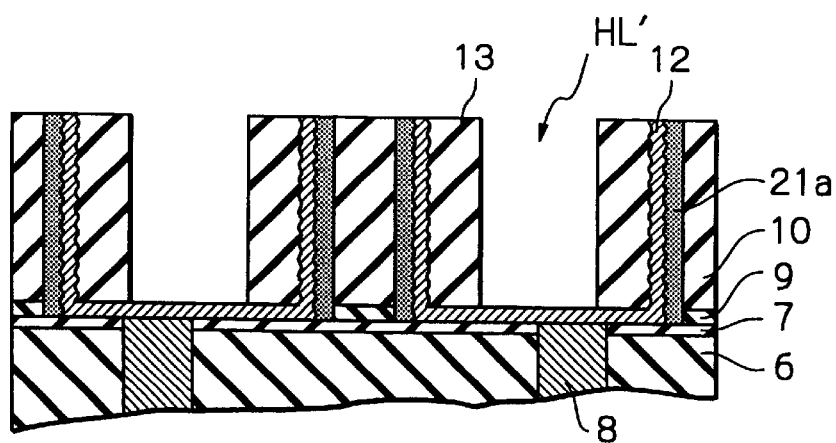
FIGS. 6A through 6K are cross-sectional views for explaining a fourth embodiment of the method for manufacturing a stacked capacitor according to the present invention.

First, referring to FIG. 6A, after the manufacturing step as illustrated in FIG. 3F is carried out, the SOG layer 13 is patterned by a photolithography and etching process to create another lower electrode hole HL'.

Figure 6B:
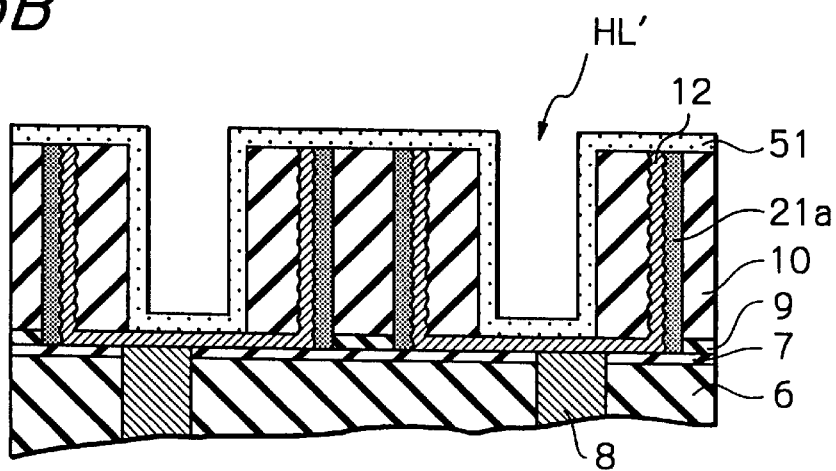

Next, referring to FIG. 6B, an about 50 nm thick phosphorus-doped amorphous silicon layer 51 is deposited by a CVD process on the entire surface, including a sidewalls of the BPSG layer 10 within the lower electrode hole HL'. In this case, the concentration of phosphorus in the amorphous silicon layer 51 is about $5.0\times10^{18}/cm^3$. Note that a non-doped amorphous silicon layer can be used instead of the doped amorphous silicon layer 51.

Figure 6C:
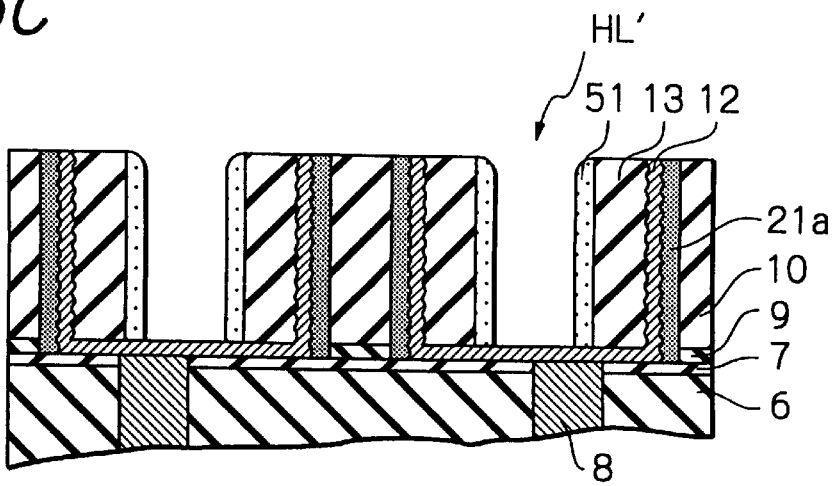

Next, referring to FIG. 6C, the amorphous silicon layer 51 is etched back by a dry etching process to allow the amorphous silicon layer 51 to remain only on the sidewalls of the SOG layer 13.

Figure 6D:
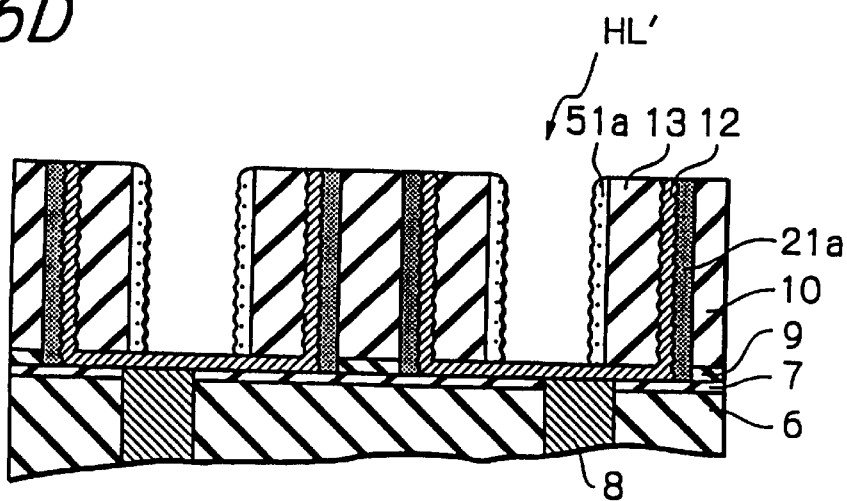

Next, referring to FIG. 6D, the amorphous silicon layer 51 is converted into an HSG polycrystalline silicon layer 51a having an uneven surface. For example, the device is put into a reaction furnace and is stabilized in high vacuum at a temperature of about 550 to 570° C. Then, silane ($SiH_4$) gas is introduced into the reaction furnace at a flow rate of about 50 to 100 sccm for about 15 to 30 minutes while maintaining the above-mentioned temperature. Then, the device is annealed in high vacuum for about 15 to 60 minutes in the same reaction furnace.

Figure 6E:
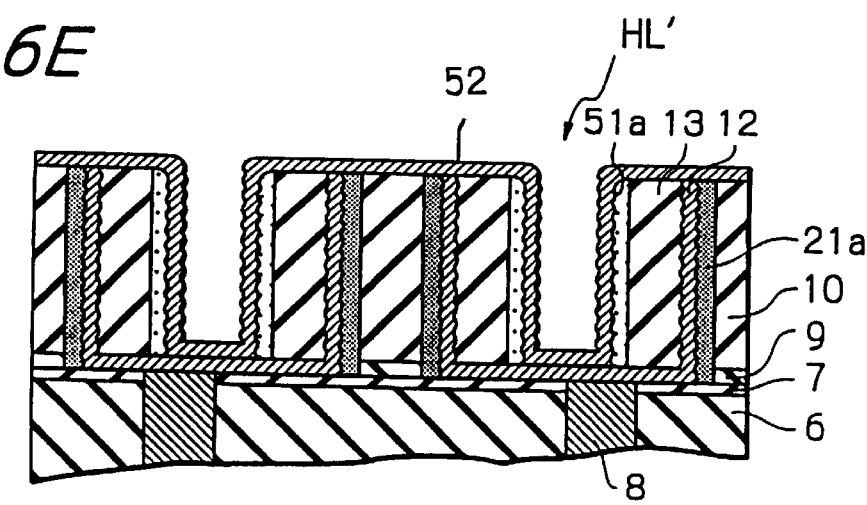

Next, referring to FIG. 6E, an about 50 nm thick W layer 52 is deposited by a CVD process on the entire surface.

Figure 6F:
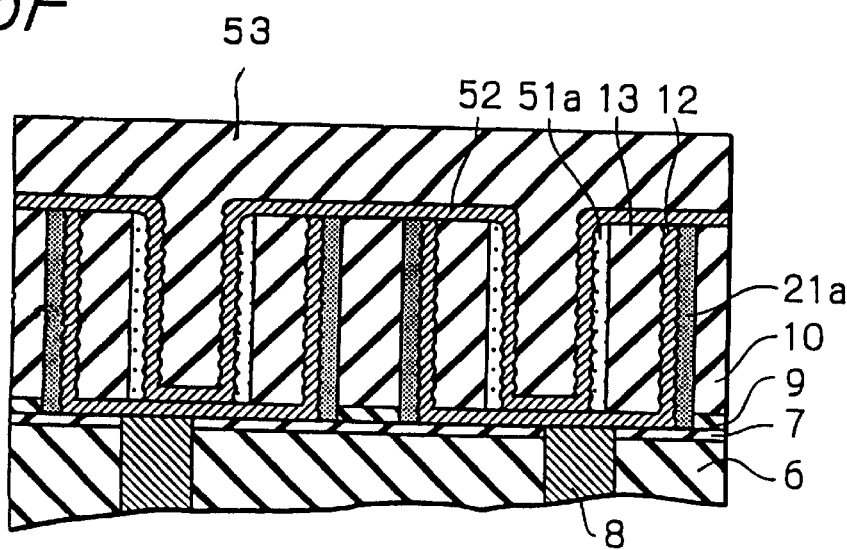

Next, referring to FIG. 6F, an SOG layer 53 made of silica glass is coated and is calcined to protect the bottom of the lower electrode hole HL'.

Figure 6G:
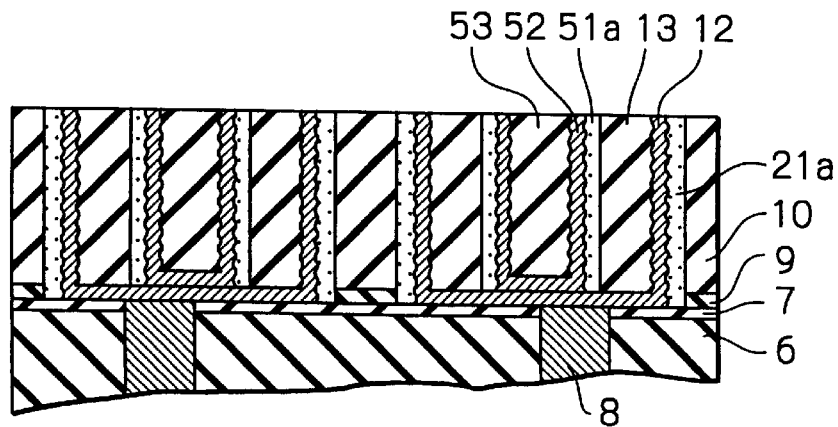

Next, referring to FIG. 6G, the SOG layer 53 and the W layer 52 are polished by a CMP process.

Figure 6H:
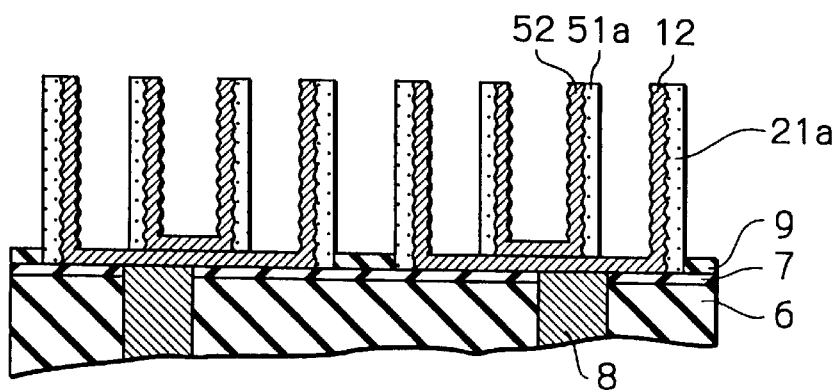

Next, referring to FIG. 6H, in a similar way to those of FIG. 3G, the SOG layers 13 and 53 and the BPSG layer 10 are removed by a wet etching process using the silicon nitride layer 9 as an etching stopper.

Figure 6I:
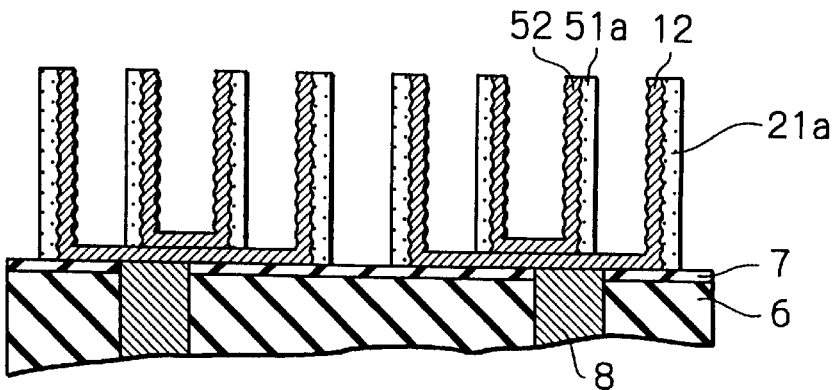

Next, referring to FIG. 6I, in a similar way to those of FIG. 3H, the silicon nitride layer 9 is removed.

Figure 6J:
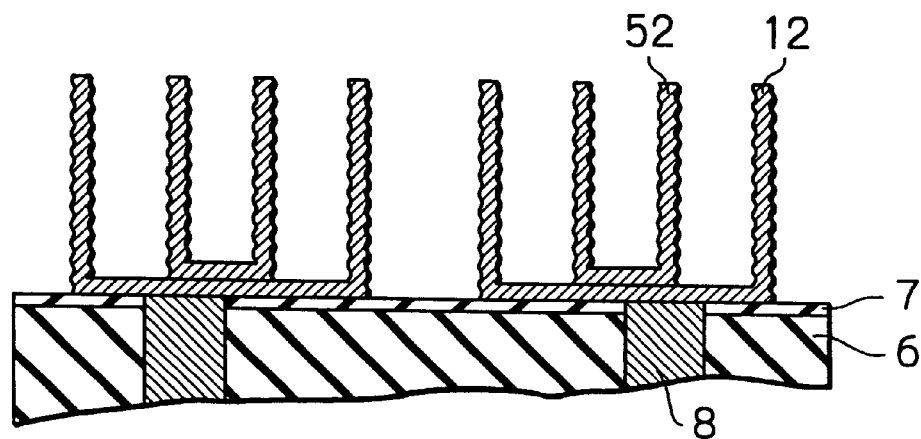

Next, referring to FIG. 6J, in a similar way to those of FIG. 3I, the HSG polycrystalline silicon layers 21a and 51a are removed by a wet etching process using a chemical solution with contents of $HF:HNO_3:H_2O = 1$ to $5\%:30$ to $60\%:30$ to $60\%$ to show an etching selectivity relative to the HSG polycrystalline silicon layer 21a and the W layer 12. Thus, a double cylindrical lower capacitor electrode is constructed by the W layers 12 and 52.

Figure 6K:
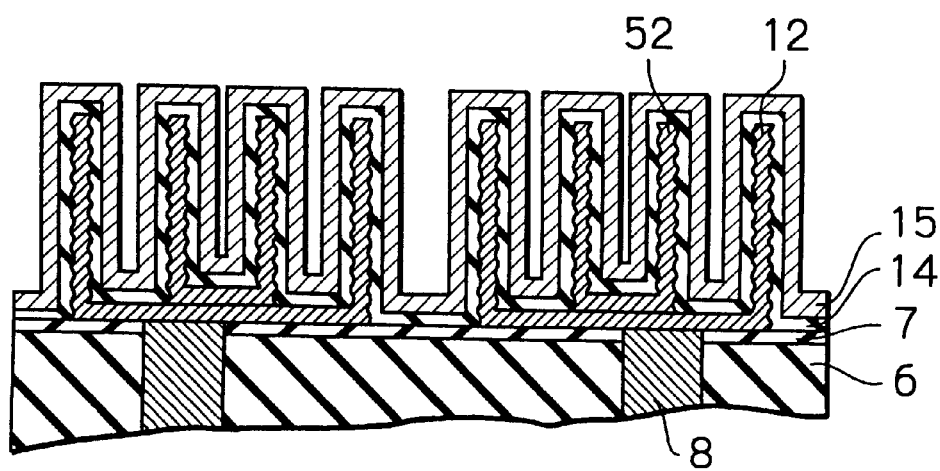

Finally, referring to FIG. 6K, in a similar way to those of FIG. 3J, a capacitor insulating layer 14 and an upper capacitor electrode 15 are formed on the cylindrical lower capacitor electrode, thus completing a cylindrical stacked capacitor.

In the method as illustrated in FIGS. 6A through 6K, since the inner and outer surfaces of the double cylindrical lower capacitor electrode are uneven, the capacity of the stacked capacitor can be larger than that of the stacked capacitor manufactured by the first embodiment.

FIGS. 7A through 7K are cross-sectional views for explaining a fifth embodiment of the method for manufacturing a stacked capacitor according to the present invention. Note that the manufacturing steps as illustrated in FIGS. 1A through 1E and FIGS. 4A through 4F are applied to the fifth embodiment.

Figure 7A:
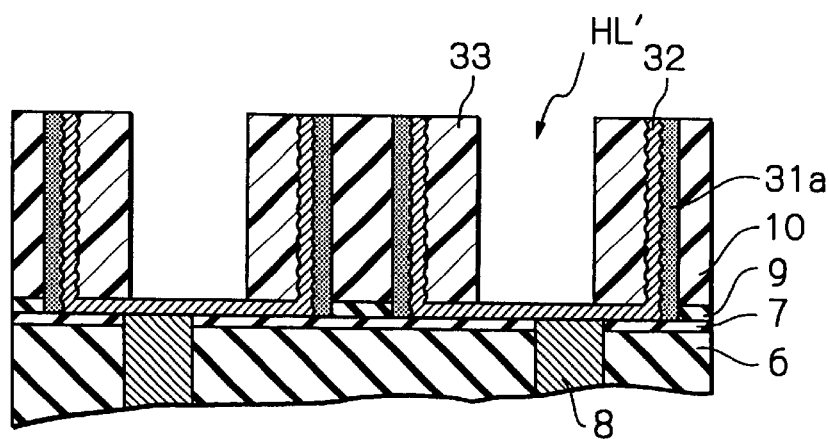
FIGS. 7A through 7L are cross-sectional views for explaining a fifth embodiment of the method for manufacturing a stacked capacitor according to the present invention.

First, referring to FIG. 7A, after the manufacturing step as illustrated in FIG. 4F is carried out, the photoresist layer 33 is patterned by a photolithography process to create another lower electrode hole HL'.

Figure 7B:
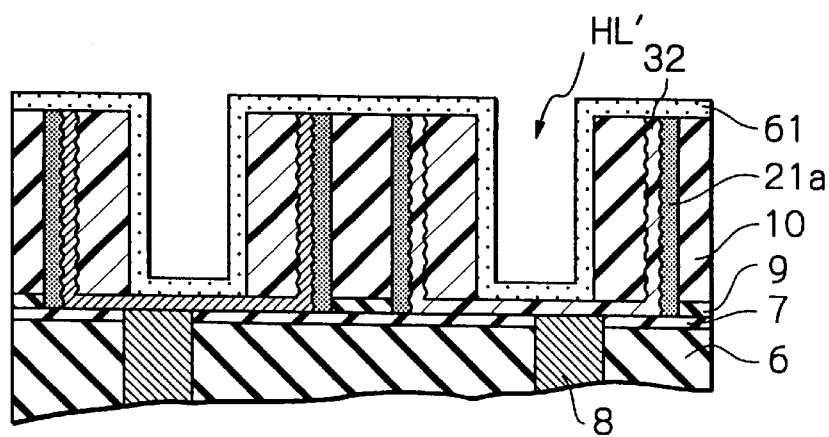

Next, referring to FIG. 7B, an about 50 nm thick amorphous silicon layer 61 is deposited by a CVD process on the entire surface, including sidewalls of the BPSG layer 10 within the lower electrode hole HL'. Note that the amorphous silicon layer 61 can be doped or non-doped.

Figure 7C:
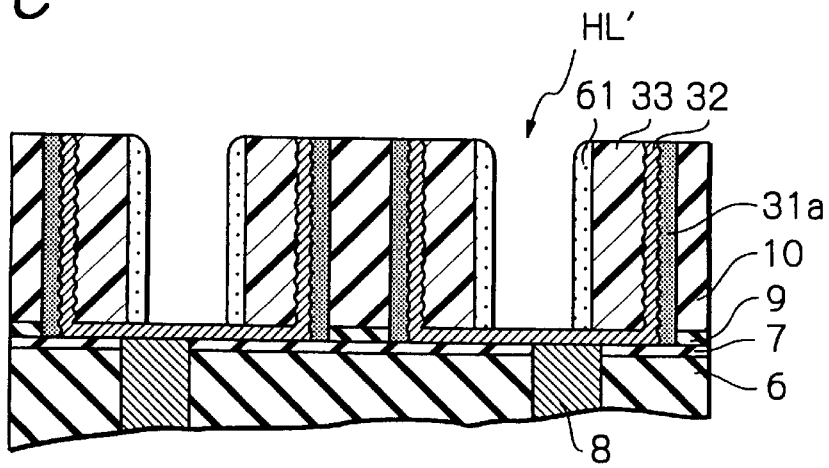

Next, referring to FIG. 7C, the amorphous silicon layer 61 is etched back by a dry etching process to allow the amorphous silicon layer 61 to remain only on the sidewalls of the BPSG layer 10.

Figure 7D:
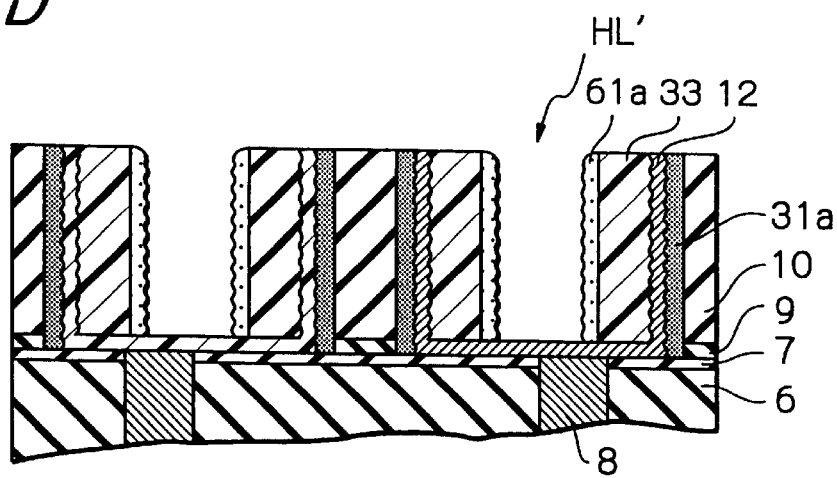

Next, referring to FIG. 7D, the amorphous silicon layer 61 is converted into an HSG polycrystalline silicon layer 61a having an uneven surface. For example, the device is put into a reaction furnace and is stabilized in high vacuum at a temperature of about 550 to 570° C. Then, silane ($SiH_4$) gas is introduced into the reaction furnace at a flow rate of about 50 to 100 sccm for about 15 to 30 minutes while maintaining the above-mentioned temperature. Then, the device is annealed in high vacuum for about 15 to 60 minutes in the same reaction furnace.

Figure 7E:
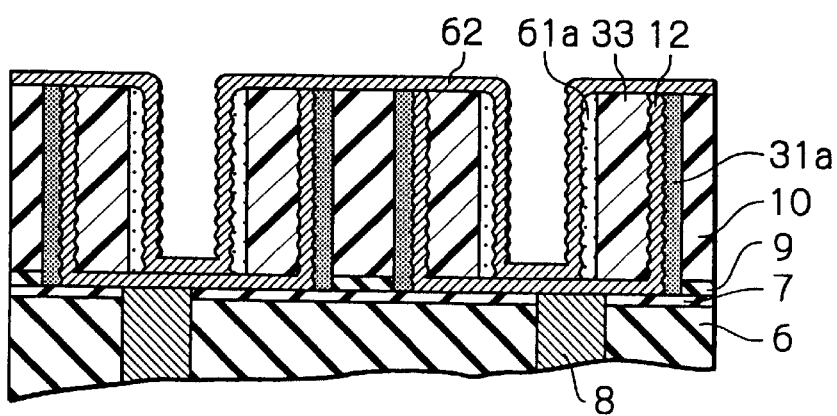

Next, referring to FIG. 7E, an about 50 nm thick TiN layer 62 is deposited by a CVD process on the entire surface.

Figure 7F:
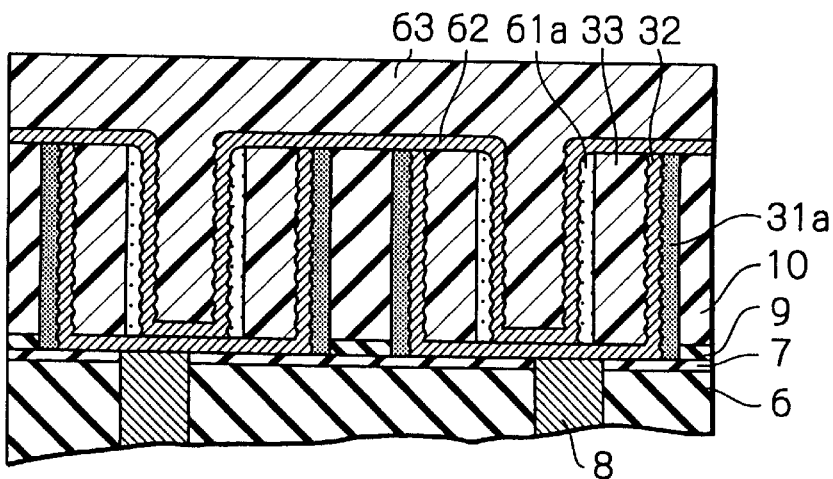

Next, referring to FIG. 7F, a photoresist layer 63 is coated and is cured to protect the bottom of the lower electrode hole HL'.

Figure 7G:
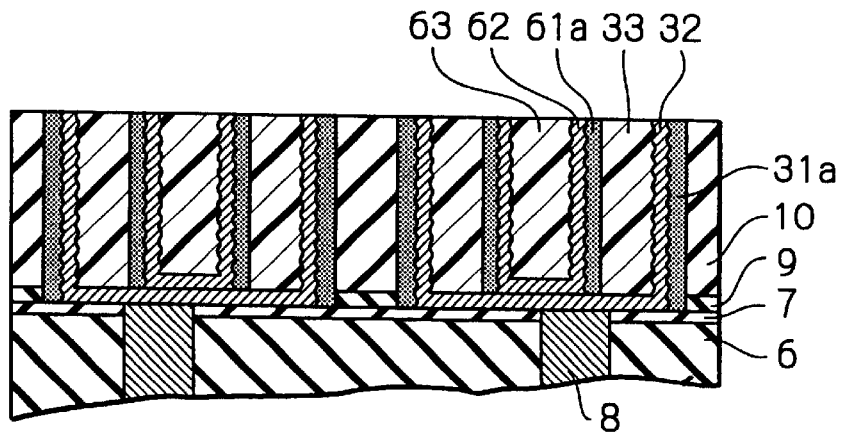

Next, referring to FIG. 7G, the photoresist layer 63 and the TiN layer 62 are etched back by a dry etching process.

Figure 7H:
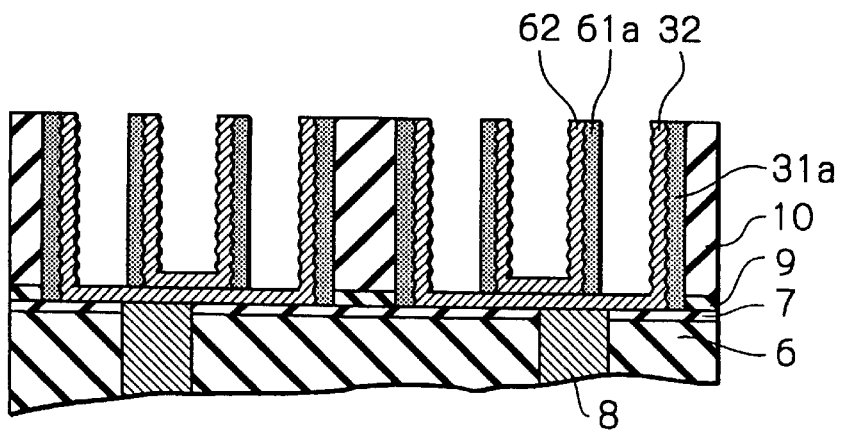

Next, referring to FIG. 7H, in a similar way to those of FIG. 4G, the photoresist layers 33 and 63 are removed by an ashing process.

Figure 7I:
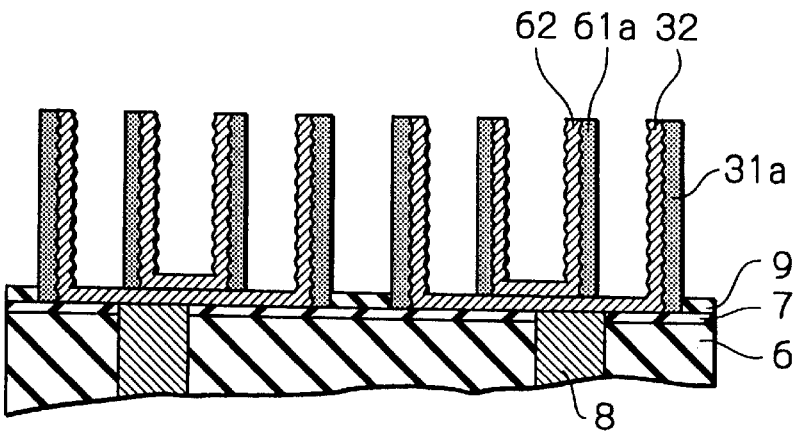

Next, referring to FIG. 7I, in a similar way to those of FIG. 4H, and the BPSG layer 10 is removed by a wet etching process using the silicon nitride layer 9 as an etching stopper.

Figure 7J:
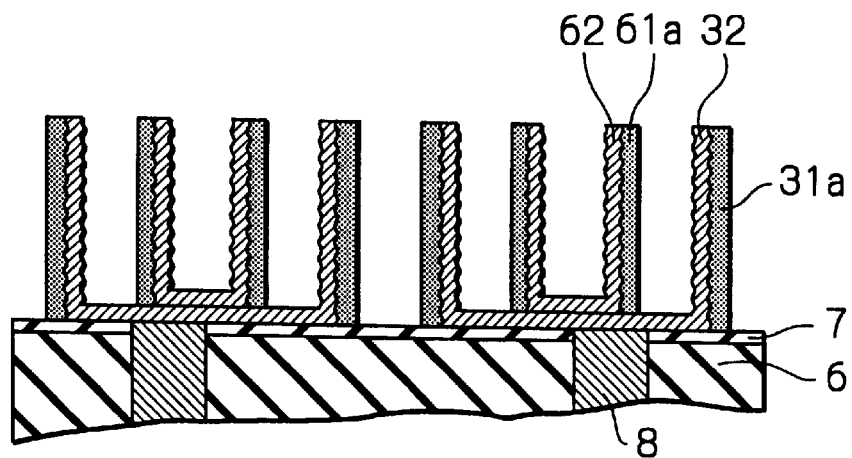

Next, referring to FIG. 7J, in a similar way to those of FIG. 4I, the silicon nitride layer 9 is removed.

Figure 7K:
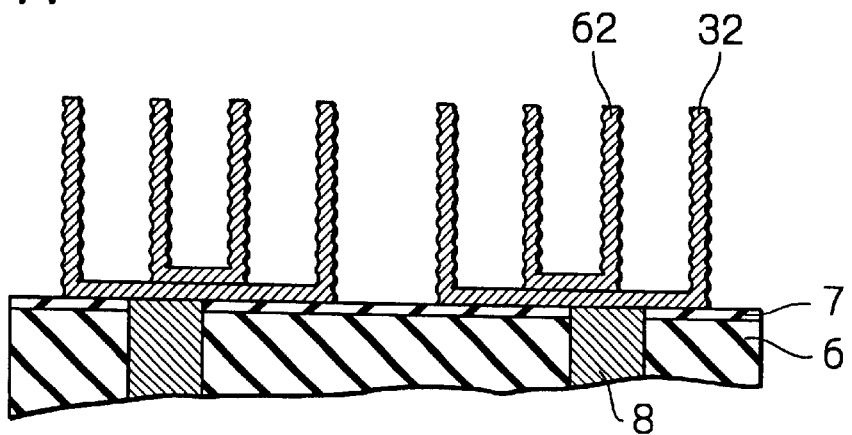

Next, referring to FIG. 7K, in a similar way to those of FIG. 4J, the HSG polycrystalline silicon layers 31a and 61a are removed by a wet etching process using a chemical solution with contents of $HF:HNO_3:H_2O = 1$ to $5\%:30$ to $60\%:30$ to $60\%$ to show an etching selectivity relative to the HSG polycrystalline silicon layer 21a and the W layer 12. Thus, a double cylindrical lower capacitor electrode is constructed by the TiN layers 32 and 62.

Figure 7L:
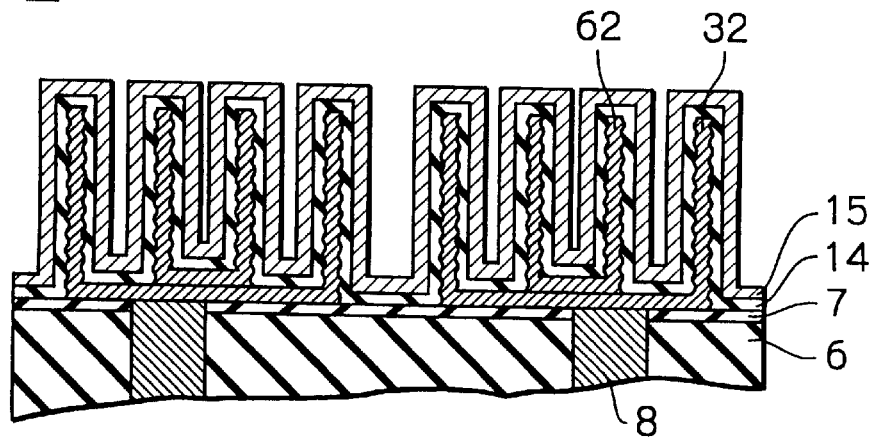

Finally, referring to FIG. 7L, in a similar way to those of FIG. 4K, a capacitor insulating layer 14 and an upper capacitor electrode 15 are formed on the cylindrical lower capacitor electrode, thus completing a cylindrical stacked capacitor.

In the method as illustrated in FIGS. 7A through 7L, since the inner and outer surfaces of the double cylindrical lower capacitor electrode are uneven, the capacity of the stacked capacitor can be larger than that of the stacked capacitor manufactured by the second embodiment.

FIGS. 8A through 8J are cross-sectional views for explaining a sixth embodiment of the method for manufacturing a stacked capacitor according to the present invention. Note that the manufacturing steps as illustrated in FIGS. 1A through 1E and FIGS. 5A through 5E are applied to the sixth embodiment.

Figure 8A:
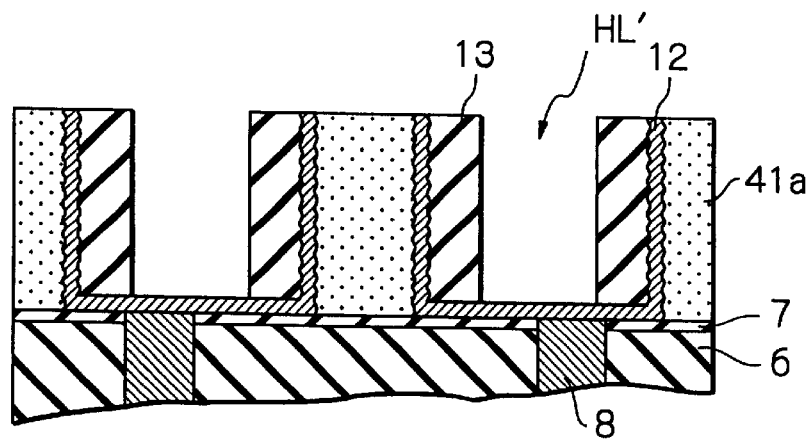
FIGS. 8A through 8J are cross-sectional views for explaining sixth embodiment of the method for manufacturing a stacked capacitor according to the present invention.

First, referring to FIG. 8A, in the same way as in FIG. 6A, after the manufacturing step as illustrated in FIG. 5E is carried out, the SOG layer 13 is patterned by a photolithography and etching process to create another lower electrode hole HL'.

Figure 8B:
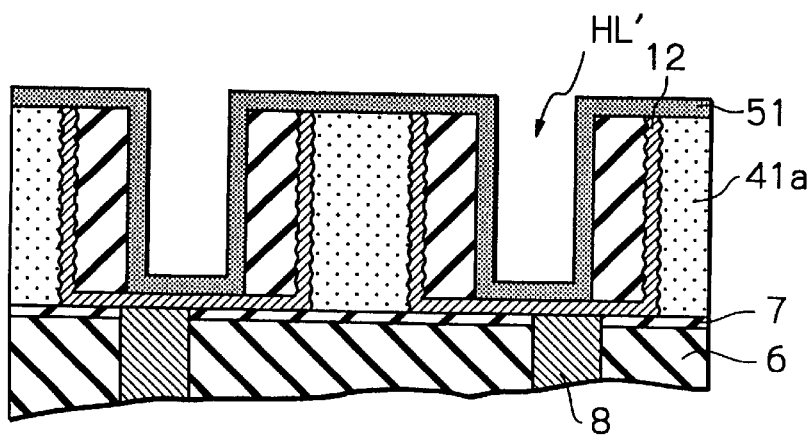

Next, referring to FIG. 8B, in the same way as in FIG. 6B, an about 50 nm thick phosphorus-doped amorphous silicon layer 51 is de posited by a CVD process on the entire surface, including sidewalls of the BPSG layer 10 within the lower electrode hole HL'. In this case, the concentration of phosphorus in the amorphous silicon layer 51 is about $5.0\times10^{18}/cm^3$. Note that a non-doped amorphous silicon layer can be used instead of the doped amorphous silicon layer 51.

Figure 8C:
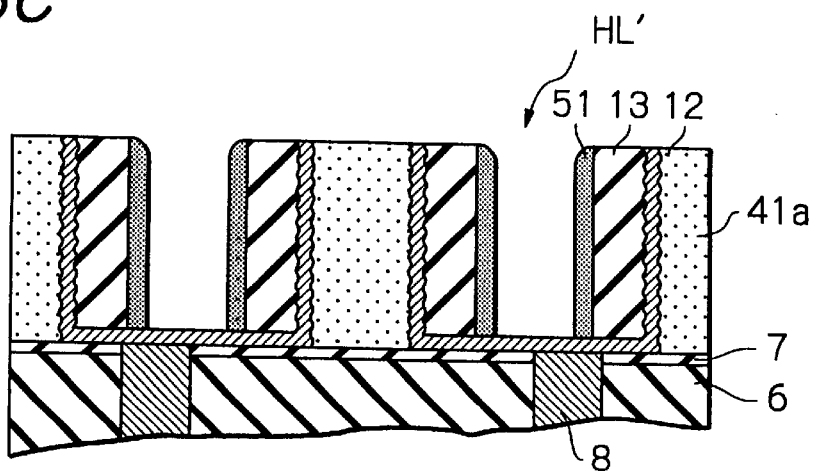

Next, referring to FIG. 8C, in the same way as in FIG. 6C, the amorphous silicon layer 51 is etched back by a dry etching process to allow the amorphous silicon layer 51 to remain only on the sidewalls of the SOG layer 13.

Figure 8D:
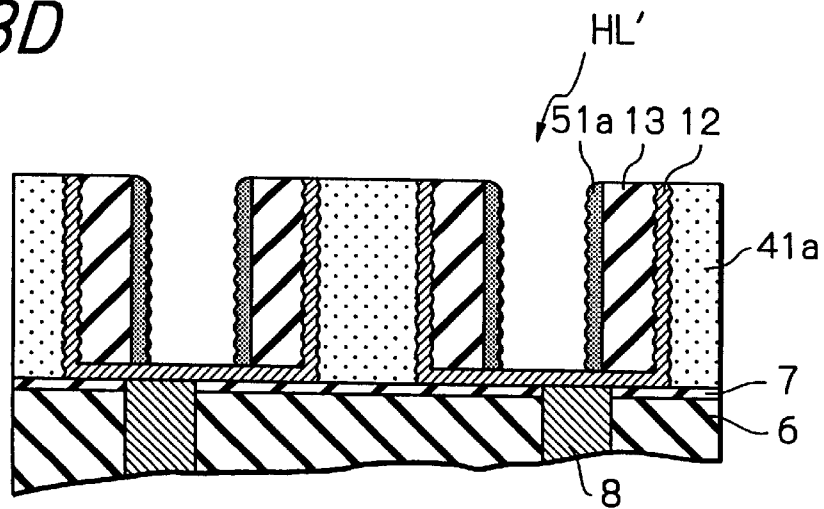

Next, referring to FIG. 8D, in the same way as in FIG. 6D, the amorphous silicon layer 51 is converted into an HSG polycrystalline silicon layer 51a having an uneven surface. For example, the device is put into a reaction furnace and is stabilized in high vacuum at a temperature of about 550 to 570° C. Then, silane ($SiH_4$) gas is introduced into the reaction furnace at a flow rate of about 50 to 100 sccm for about 15 to 30 minutes while maintaining the above-mentioned temperature. Then, the device is annealed in high vacuum for about 15 to 60 minutes in the same reaction furnace.

Figure 8E:
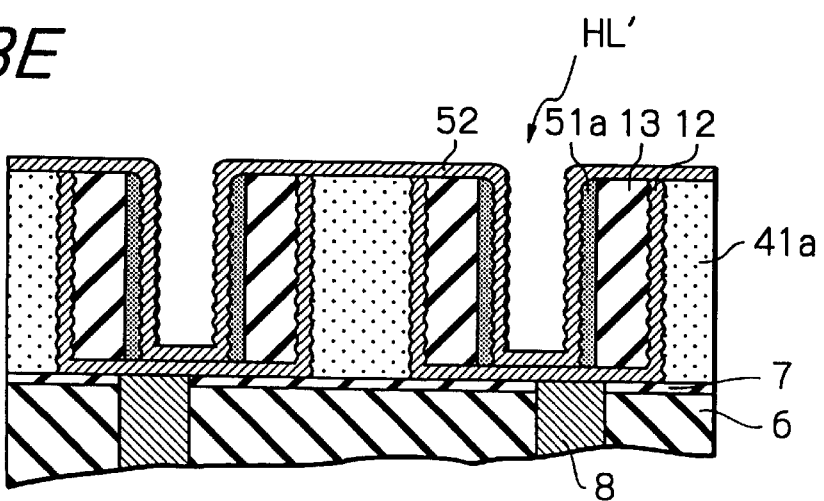

Next, referring to FIG. 8E, in the same way as in FIG. 6E, an about 50 nm thick W layer 52 is deposited by a CVD process on the entire surface.

Figure 8F:
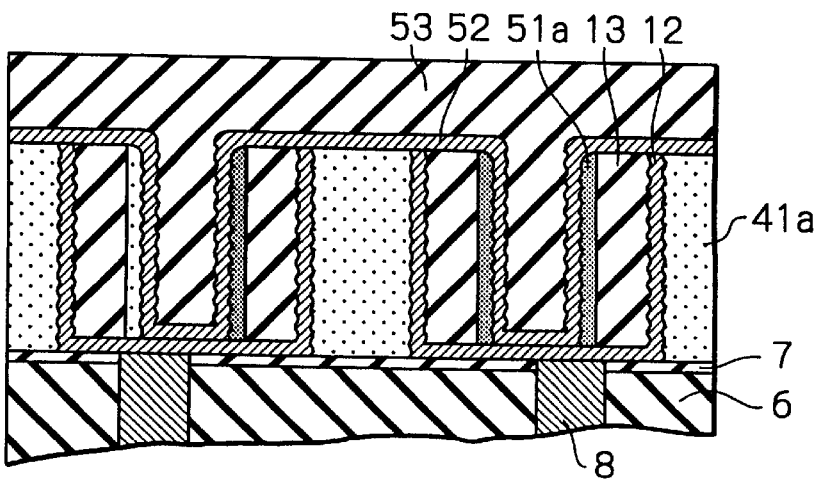

Next, referring to FIG. 8F, in the same way as in FIG. 6F, an SOG layer 53 made of silica glass is coated and is calcined to protect the bottom of the lower electrode hole HL'.

Figure 8G:
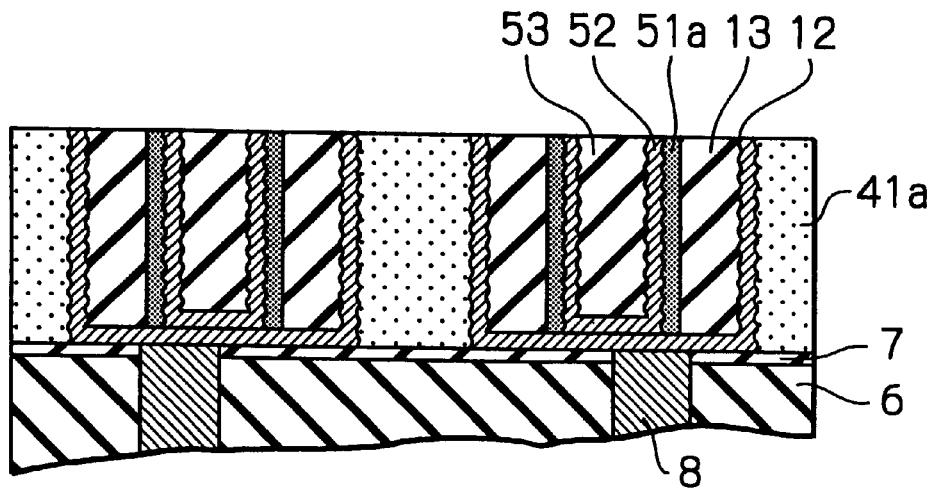

Next, referring to FIG. 8G, in the same way as in FIG. 6G, the SOG layer 53 and the W layer 52 are polished by a CMP process.

Figure 8H:
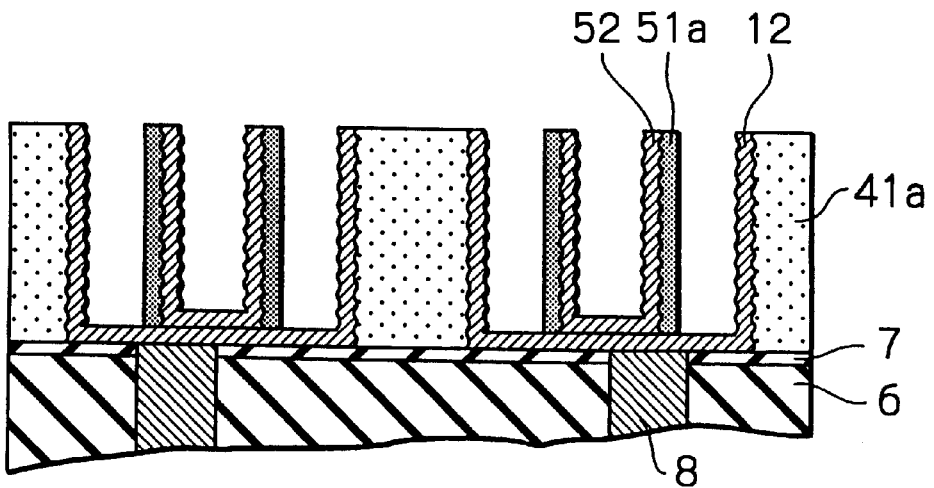

Next, referring to FIG. 8H, in a similar way to those of FIG. 6H, the SOG layers 13 and 53 are removed by a wet etching process.

Figure 8I:
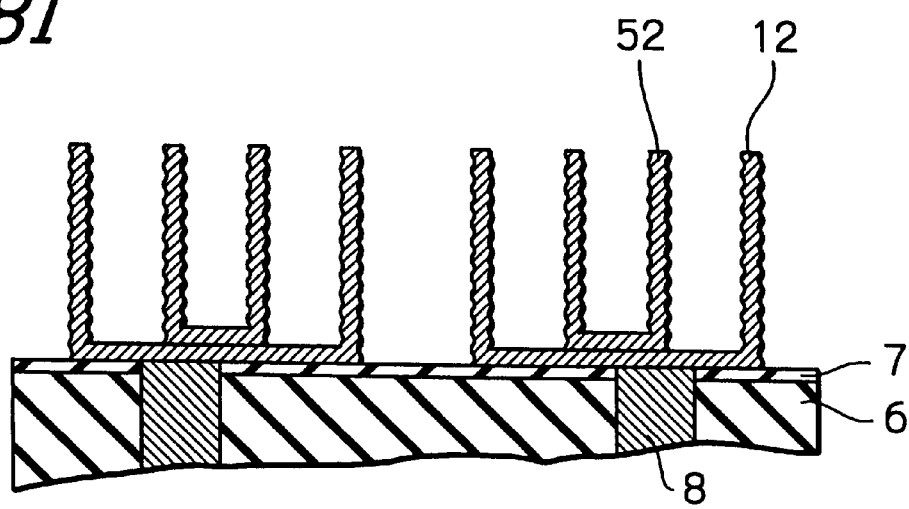

Next, referring to FIG. 8I, in a similar way to those of FIG. 6J, the HSG polycrystalline silicon layers 41a and 51a are removed by a wet etching process using a chemical solution with contents of $HF:HNO_3:H_2O=1$ to 5%:30 to 60%:30 to 60% to show an etching selectivity relative to the HSG polycrystalline silicon layer 21a and the W layer 12. Thus, a double cylindrical lower capacitor electrode is constructed by the W layers 12 and 52.

Figure 8J:
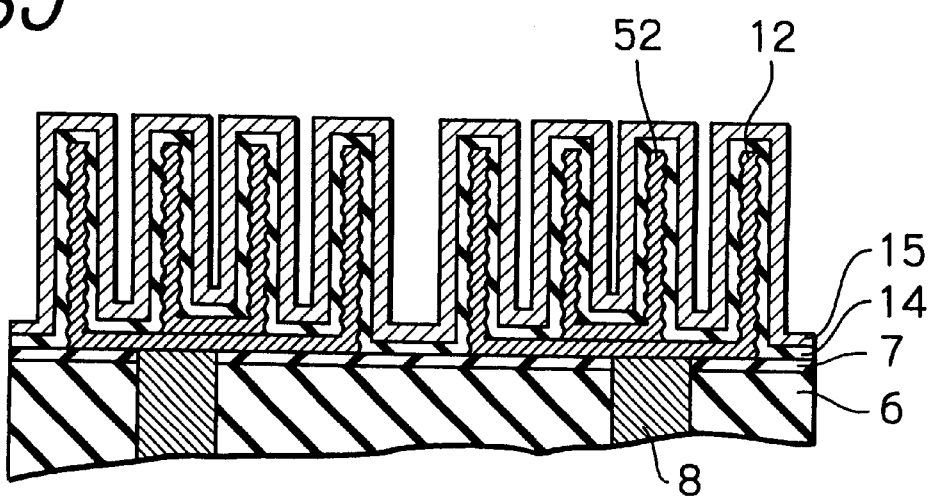

Finally, referring to FIG. 8J, in the same way as in FIG. 6K, a capacitor insulating layer 14 and an upper capacitor electrode 15 are formed on the cylindrical lower capacitor electrode, thus completing a cylindrical stacked capacitor.

In the method as illustrated in FIGS. 8A through 8J, since the inner and outer surfaces of the double cylindrical lower capacitor electrode are uneven, the capacity of the stacked capacitor can be larger than that of the stacked capacitor manufactured by the third embodiment.

In the above-described embodiments, a single cylindrical stacked capacitor or a double cylindrical stacked capacitor is explained; however, the present invention can be applied to a multiple cylindrical stacked capacitor having a triple or more cylindrical structure.

As explained hereinabove, according to the present invention, since the inner and outer surfaces of a lower capacitor electrode are both caused to be uneven, the capacity of a stacked capacitor can be remarkably increased.

What is claimed is:

1. A capacitor comprising:

a cylindrical lower capacitor electrode layer having uneven inner and outer surfaces;

a capacitor insulating layer formed on said cylindrical lower capacitor electrode layer; and an upper capacitor electrode layer formed on said capacitor insulating layer, wherein said uneven inner and outer surfaces of said cylindrical lower capacitor electrode layer are obtained by transferring and subsequently removing hemispherical grained polycrystalline silicon.

2. The capacitor as set forth in claim 1, further comprising:

a semiconductor substrate;

an insulating layer formed on said semiconductor substrate;

a conductive contact plug buried in a contact hole of said insulating layer, said conductive plug being electrically connected to said cylindrical lower capacitor electrode layer.

3. A capacitor comprising:

a cylindrical lower capacitor electrode layer having uneven inner and outer surfaces;

a capacitor insulating layer formed on said cylindrical lower capacitor electrode layer; and an upper capacitor electrode layer formed on said capacitor insulating layer, wherein said cylindrical lower capacitor electrode layer is made of one of metal and metal compound.

4. A capacitor comprising:

a cylindrical lower capacitor electrode layer having uneven inner and outer surfaces;

a capacitor insulating layer formed on said cylindrical lower capacitor electrode layer; and an upper capacitor electrode layer formed on said capacitor insulating layer, wherein said cylindrical lower capacitor electrode layer is made of tungsten.

5. A capacitor comprising:

a cylindrical lower capacitor electrode layer having uneven inner and outer surfaces;

a capacitor insulating layer formed on said cylindrical lower capacitor electrode layer; and an upper capacitor electrode layer formed on said capacitor insulating layer, wherein said cylindrical lower capacitor electrode layer is made of titanium nitride.

* * * * *